(12) United States Patent
Kitamura et al.

(10) Patent No.: US 7,496,878 B2
(45) Date of Patent: Feb. 24, 2009

(54) AUTOMATIC WIRING METHOD AND APPARATUS FOR SEMICONDUCTOR PACKAGE AND AUTOMATIC IDENTIFYING METHOD AND APPARATUS FOR SEMICONDUCTOR PACKAGE

(75) Inventors: Tamotsu Kitamura, Nagano (JP); Norihide Hanami, Nagano (JP)

(73) Assignee: Shinko Electrics Industries Co., Ltd., Nagano (JP)

( * ) Notice: Subject to any disclaimer, the term of this patent is extended or adjusted under 35 U.S.C. 154(b) by 290 days.

(21) Appl. No.: 11/103,626

(22) Filed: Apr. 12, 2005

(65) Prior Publication Data

US 2005/0229138 A1    Oct. 13, 2005

(30) Foreign Application Priority Data

Apr. 13, 2004   (JP)   ............................. 2004-118242

(51) Int. Cl.
    *G06F 17/50*    (2006.01)
(52) U.S. Cl. ............................. 716/13; 716/12; 716/14; 716/15
(58) Field of Classification Search ............... 716/2, 716/8–15
    See application file for complete search history.

(56) References Cited

U.S. PATENT DOCUMENTS 4,630,219 A *  12/1986  DiGiacomo et al. ............ 716/9
6,121,554 A *   9/2000  Kamikawa .................... 174/260
6,215,184 B1*   4/2001  Stearns et al. ................ 257/738
6,245,599 B1    6/2001  Goto et al.
6,295,634 B1*   9/2001  Matsumoto ................... 716/12
6,397,376 B1    5/2002  Sakurai et al.
6,516,446 B2*   2/2003  Anzai .............................. 716/1
6,596,549 B2    7/2003  Kitamura et al.
6,798,075 B2*   9/2004  Liaw et al. ................... 257/784
6,810,442 B1*  10/2004  Lin et al. ....................... 710/22

FOREIGN PATENT DOCUMENTS

| JP | 2000-35986 | 2/2000 |
| JP | 2001-15637 | 1/2001 |
| JP | 2002-83006 | 3/2002 |

* cited by examiner

*Primary Examiner*—Vuthe Siek
(74) *Attorney, Agent, or Firm*—Staas & Halsey LLP

(57) ABSTRACT

A semiconductor package automatic wiring apparatus which determines an optimum wiring route from each pad to a corresponding one of vias on a semiconductor package having a multi-tier bonding pad structure in which pads to be connected to a semiconductor chip are arranged in multiple rows, comprises: row identifying means for identifying each pad as to which row the pad belongs to; tentative placement means for mapping the position of the pad to a position on a matrix table after the pad has been identified by the row identifying means as to which row the pad belongs to; and determining means for determining the optimum wiring route based on the matrix table generated by the tentative placement means.

44 Claims, 35 Drawing Sheets

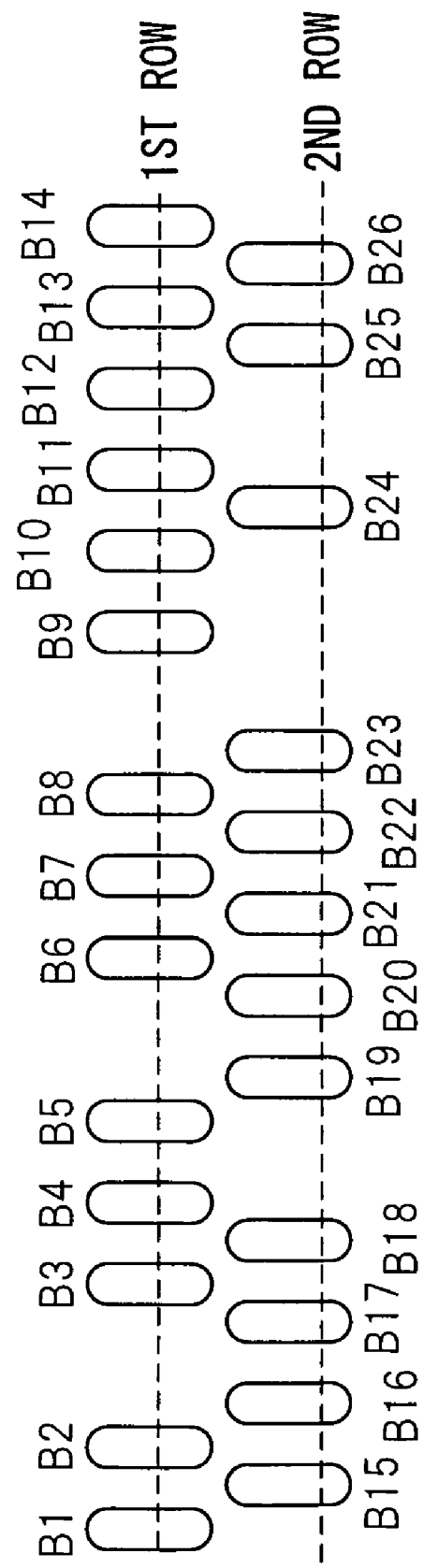

1ST ROW

2ND ROW

← REVERSE SEARCH

| 1ST ROW | B11 | B12 | B13 | B14 | B15 | B16 | B17 |
|---|---|---|---|---|---|---|---|

| 2ND ROW | B21 | B22 | B23 |
|---|---|---|---|

| 3RD ROW | B31 |
|---|---|

Fig.22a
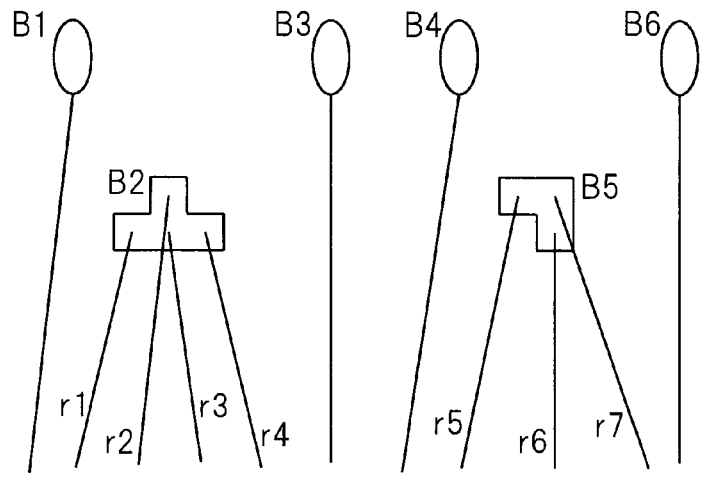
Fig.22b
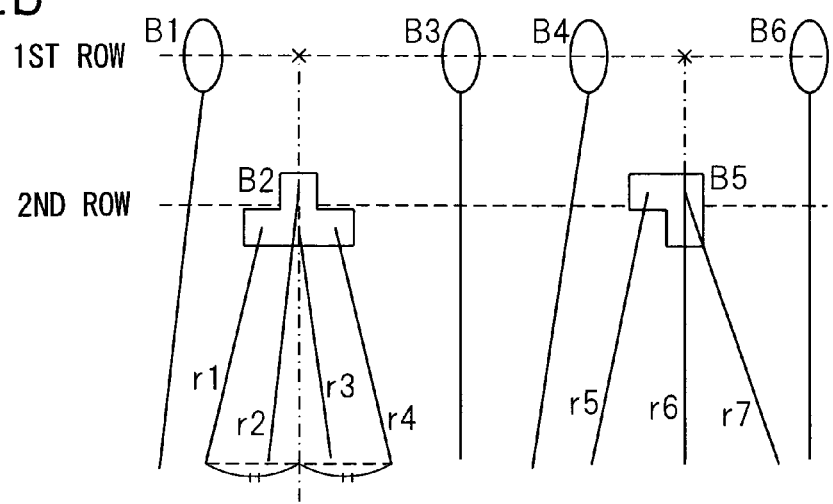
Fig.22c

| | 1ST COLUMN | 2ND COLUMN | 3RD COLUMN | 4TH COLUMN | 5TH COLUMN | 6TH COLUMN | 7TH COLUMN | 8TH COLUMN | 9TH COLUMN | 10TH COLUMN | |
|---|---|---|---|---|---|---|---|---|---|---|---|
| | B11 | | B12 | B13 | B14 | B15 | B16 | | | B17 | 1ST ROW |
| | | B21 | | | | B22 | | B23 | | | 2ND ROW |
| | | | | | | | | | B31 | | 3RD ROW |

Fig.24
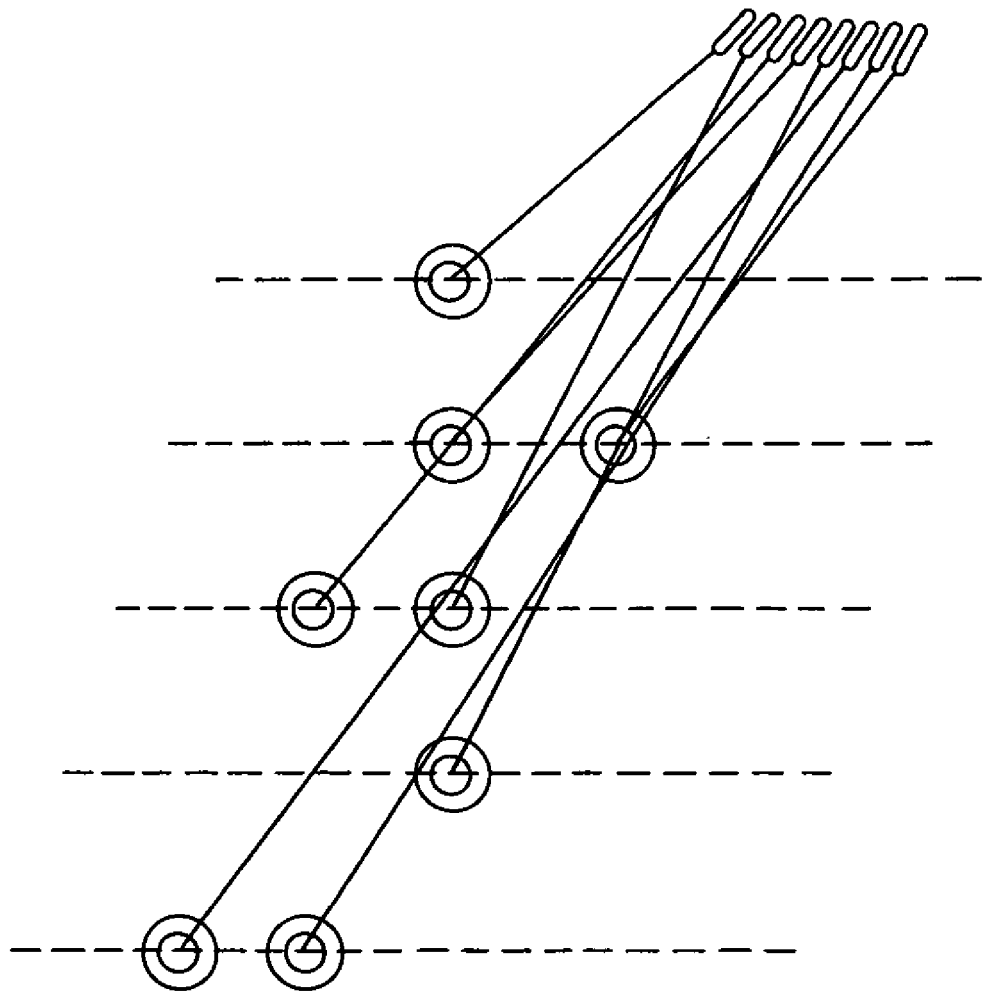
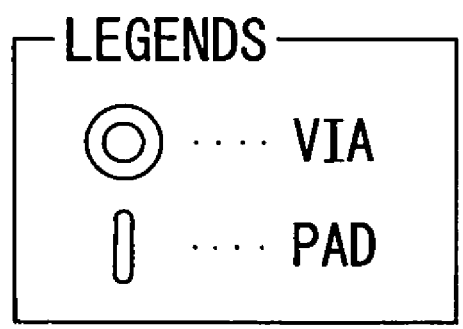

Fig.29a

| B11 | B12 | B13 | B14 | | B15 | | | B16 | | B17 | |
|---|---|---|---|---|---|---|---|---|---|---|---|
| | B21 | | | B22 | | B23 | | B24 | | | B25 |
| | | | | B31 | | | B32 | | B33 | B34 | |

Fig.29b

| B11 | B12 | B13 | B14 | | B15 | | | B16 | | B17 | |
|---|---|---|---|---|---|---|---|---|---|---|---|
| | B21 | | | B22 | | B23 | | B24 | | | B25 |
| | | | | B31 | | | B32 | | B33 | B34 | |

Fig.30a

| | | | | | | | | 1ST ROW |
|---|---|---|---|---|---|---|---|---|
| B11 | B12 | B13 | B14 | B15 | B16 | B17 | | |
| | | B21 | B22 | B23 | B24 | | B25 | 2ND ROW |
| | | | B31 | B32 | B33 | B34 | | 3RD ROW |

Fig.30b

| | | | | | | | | 1ST ROW |
|---|---|---|---|---|---|---|---|---|
| B11 | B12 | B13 | B14 | B15 | B16 | B17 | | |
| | | B21 | B22 | B23 | B24 | | B25 | 2ND ROW |
| | | | B31 | B32 | B33 | B34 | | 3RD ROW |

Fig.30c

| B11 | B12 | B21 | B13 | B14 | B22 | B31 | B15 | B23 | B32 | B16 | B24 | B33 | B17 | B34 | B25 | 1ST ROW |

Fig.31a
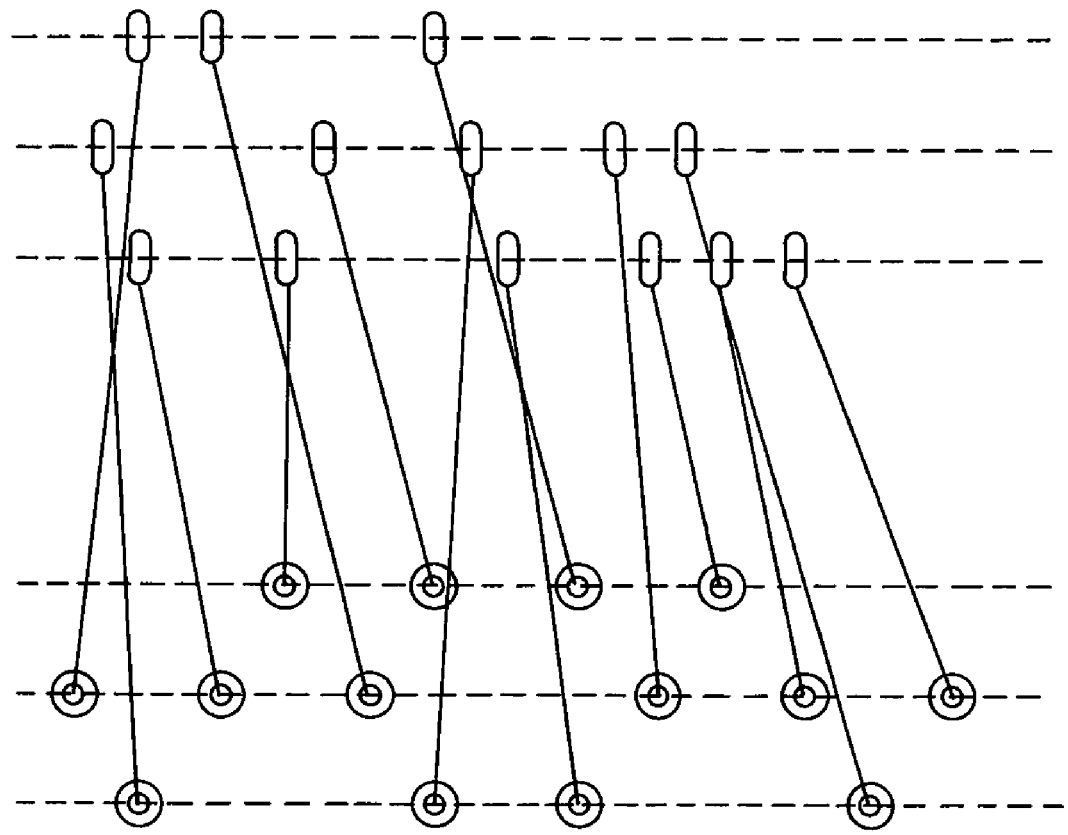
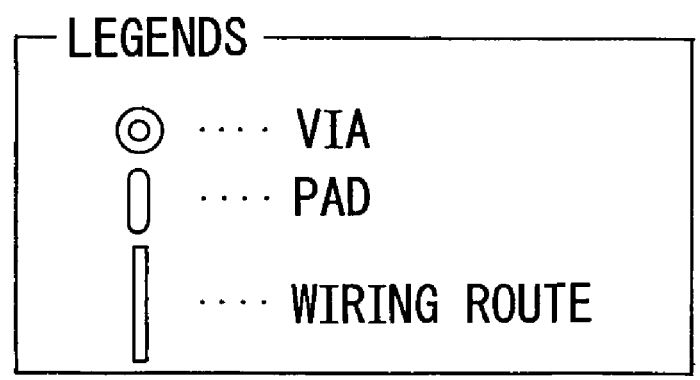

LEGENDS

◉ .... VIA

▯ .... PAD

▮ .... WIRING ROUTE

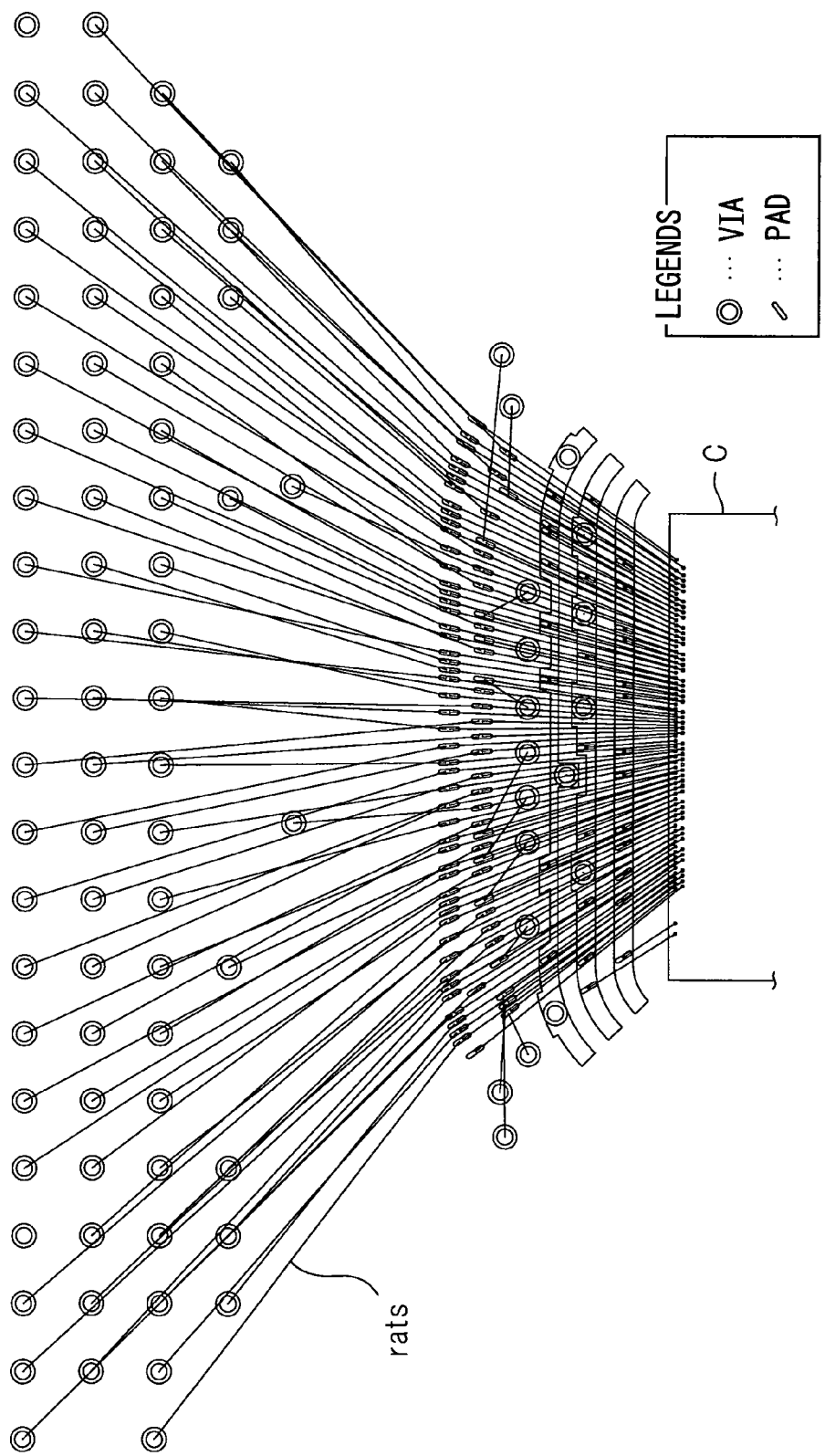

Fig.36c
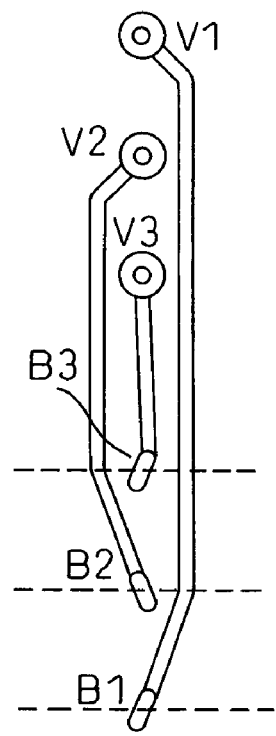
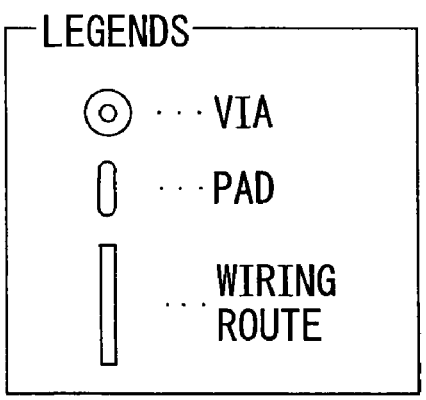
Fig.36d
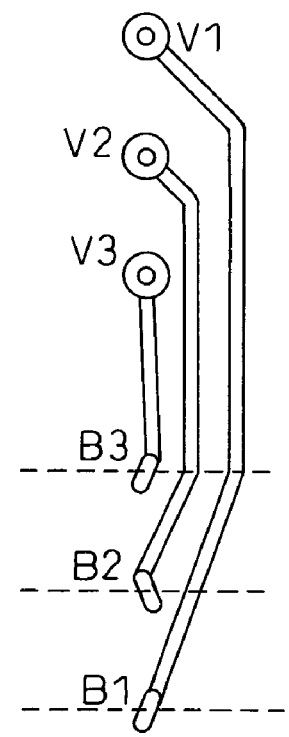
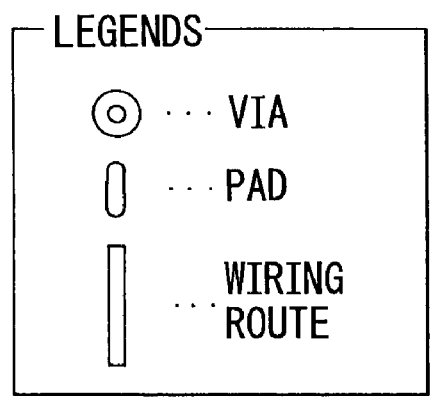

AUTOMATIC WIRING METHOD AND APPARATUS FOR SEMICONDUCTOR PACKAGE AND AUTOMATIC IDENTIFYING METHOD AND APPARATUS FOR SEMICONDUCTOR PACKAGE

BACKGROUND OF THE INVENTION

1. Field of the Invention

The present invention relates to an automatic wiring method and apparatus for a semiconductor package having a multi-tier bonding pad structure, in which the pads to be connected to a semiconductor chip are arranged in multiple rows, and also relates to an automatic identifying method and apparatus for a semiconductor package for identifying each pad, as to the row to which the pad belongs, in a multi-tier bonding pad arrangement in which the pads to be connected to a semiconductor chip are arranged in multiple rows.

2. Description of the Related Art

In a semiconductor package such as a PBGA or EBGA package, a wiring pattern is designed so as to connect the pads (for example, bonding pads or flip chip pads), to be electrically connected to electrode terminals on a semiconductor chip, to the vias (land portions) provided along the periphery thereof, or to connect between the vias. The designer, using a CAD system, designs wiring routes for a semiconductor package on a virtual plane through trial and error, but the problem is that this design procedure is extremely time and labor consuming.

Several methods have been proposed to solve this problem. For example, Japanese Unexamined Patent Publication No. 2002-083006 discloses a method in which only wiring routes are defined in advance in a rough wiring step, and then, in a wiring forming step, the wiring lines are laid automatically and uniformly by considering lines and spaces while checking them against the actual design rules. Further, Japanese Unexamined Patent Publication No. 2001-15637, for example, discloses a method in which combinations for interconnecting between a plurality of solder ball connection pads and a plurality of wire bond pads are automatically selected in order to generate optimum candidates for interconnecting them. On the other hand, Japanese Unexamined Patent Publication No. 2000-35986, for example, discloses a method for making interconnections, efficiently and in a short period of time, between an array of inner leads and any array of lands arranged in a matrix form around the periphery thereof.

The above prior art methods are intended for application to the so-called "single-tier bonding pad structure" in which the pads to be connected to a semiconductor chip are arranged in a single row.

On the other hand, the "multi-tier bonding pad structure" in which the pads are arranged in multiple rows has come into widespread use in recent years.

FIG. 34 is a diagram showing by way of example the nets to be routed on a semiconductor package having a multi-tier bonding pad structure. On the semiconductor package, wiring lines are routed in such a manner as to extend substantially radially from the pads, to be connected to a semiconductor chip C placed in the center of a substrate, toward the vias provided on the periphery thereof. In this figure, the nets to be connected to the vias from the pads (bonding pads) arranged in two rows for one of the four sides of the semiconductor chip C are shown by straight lines (i.e., rats).

FIG. 35 is a diagram showing an example of actual wiring on the semiconductor package having the multi-tier bonding pads shown in FIG. 34. In accordance with the nets to be connected, as shown by the rats in FIG. 34, the wiring pattern is designed so that the wiring lines between the pads and the vias or between the vias will not cross each other, as shown in FIG. 35. At the same time, the wiring lines must be routed so as to satisfy the design rules by considering the lines and spaces between the pads and the vias or between the vias.

FIGS. 36a to 36d are diagrams (part 1) for explaining a variation of the wiring routing in the multi-tier bonding pad structure. In the figures, reference characters B1 to B3 are identification numbers assigned to the pads, for convenience, and reference characters V1 to V3 are identification numbers assigned to the vias, for convenience.

As shown, in the three-tier bonding pad structure in which the pads B1 to B3 belong to different rows (tiers), when connecting the pad B1 to the via V1, the pad B2 to the via V2, and the pad B3 to the via V3, respectively, there are four possible wiring route patterns as shown in FIGS. 36a to 36d.

FIGS. 37a to 37e are diagrams (part 2) for explaining a variation of the wiring routing in the multi-tier bonding pad structure. In the figures, reference characters B1 to B3 are identification numbers assigned to the pads for convenience, and reference characters V1 to V3 are identification numbers assigned to the vias for convenience.

As shown, in the three-tier bonding pad structure in which the pads B1 to B3 belong to different rows, when connecting between the pads B1 to B3 and the vias V1 to V3 in different combinations, there are five possible wiring route patterns as shown in FIGS. 37a to 37e.

In this way, in the case of multi-tier bonding pads, the design becomes further complex because, compared with single-tier bonding pads, there are many possible variations for the wiring routes connecting between the pads and the vias.

Furthermore, with recent improvements in semiconductor package and printed wiring board technologies, coupled with increasing variety and complexity of their applications, the kinds of arrangements, for the pads to be connected to semiconductor chips, have been increasing in variety and number.

FIGS. 38 and 39 are diagrams showing examples of the single-tier bonding pad arrangement, and FIGS. 40 to 43 are diagrams each showing the bonding pads arranged in two rows as an example of the multi-tier bonding pad arrangement. FIG. 44 is a diagram showing the bonding pads arranged in three rows as an example of the multi-tier bonding pad arrangement. Generally, semiconductor chips are rectangular in shape, and FIGS. 38 to 44 each show the pads (bonding pads) to be connected to chip pads on one of the four sides of the semiconductor chip. In FIG. 44, reference characters B11 to B17, B21 to B23, and B31 are identification numbers assigned to the pads for convenience.

Generally, in the single-tier bonding pad arrangement, the pads B are arranged in a straight line as shown in FIG. 38 or in an arc as shown in FIG. 39. In some designs, the pads may be arranged in other ways, for example, in a shape combining a straight line and an arc, though this is not shown here.

On the other hand, in the multi-tier bonding pad arrangement, the pads B are arranged in multiple rows in straight lines as shown in FIG. 40, or in arcs as shown in FIGS. 41 and 44, or in a shape combining a straight line and an arc as shown in FIGS. 42 and 43.

As described above, in the case of the multi-tier bonding pad arrangement, the number of wire routing variations that can be designed is much larger than in the case of the single-tier bonding pad arrangement, and the reality is that, because of its complexity, the designer manually performs the design work by relying on his experience and on intuition. As the designer has to manually design the optimum routing free from crossings of wiring lines, while satisfying the design rules, by trial and error or by actually making wire connections and making necessary corrections, the design quality and the time required to complete the design greatly depend on the designer's skill, experience, and intuition.

To alleviate the burden on the designer and to achieve a wiring design of stable quality, several automatic wiring methods including those described above have been proposed for single-tier bonding pads, but in the case of multi-tier bonding pads, it is difficult to automate the wiring design work because of its complexity as well as the large variety of possible wiring routes.

Here, the CAD system used for wiring design can grasp information about the XY coordinates of each pad on a virtual plane as well as information about the width of each pad, but cannot grasp information about the way the pads are arranged. On the designer side, the row to which each pad belongs can be easily identified by visual inspection, but on the CAD system side, given only the information about the width of the pad and about its XY coordinates on the virtual plane, it is difficult to identify, for each pad, the row to which it belongs. For example, in FIG. 44, the pad B11 and the pad B22 have approximately the same Y-coordinate value on the virtual plane, but actually, they belong to different rows. In this way, it can be said that, while grasping the information about the width of each pad and about its XY coordinates on the virtual plane, how the pads having a variety of shapes and orientations are to be identified using a processing unit is also an issue of great importance.

In view of the above problem, it is an object of the present invention to provide an automatic wiring method and apparatus for automating wiring design work for a semiconductor package having a multi-tier bonding pad structure in which the pads to be connected to a semiconductor chip are arranged in multiple rows, and also provide an automatic identifying method and apparatus for a semiconductor package for accurately identifying each pad as to the row to which the pad belongs, in a multi-tier bonding pad arrangement in which the pads to be connected to a semiconductor chip are arranged in multiple rows.

SUMMARY OF THE INVENTION

To achieve the above object, according to the present invention, by using a processing unit such as a computer, an arrangement of multi-tier bonding pads, in which the pads to be connected to a semiconductor chip are arranged in multiple rows, is expressed in the form of a matrix table such that the space between adjacent columns corresponds to the space between pads through which a wiring route can pass, and software is run to perform processing to determine, based on this matrix table, an optimum wiring route from each pad to its corresponding via. More specifically, based on the generated matrix table, candidates for the wiring route from the pad to the via are produced, and each wiring route candidate is evaluated to determine whether the wiring route crosses any other wiring route when the wiring route is laid from the pad to the via in accordance with the wiring route candidate; if the wiring route does not cross any other wiring route, then the wiring route candidate is determined as the optimum wiring route. If there are no wiring route candidates that do not cross another wiring route, then in the plurality of wiring route candidates, the wiring route candidate that provides the wider clearance is determined as the optimum wiring route. Prior to the generation of the matrix table, it is preferable to perform processing, using a processing unit such as a computer, for identifying the pads in the multi-tier bonding pad arrangement as to the rows to which the respective pads belong.

FIG. 1 is a block diagram for explaining the basic principle (part 1) of an automatic wiring apparatus according to the present invention.

The semiconductor package automatic wiring apparatus 1 which determines an optimum wiring route from each pad to a corresponding one of vias on a semiconductor package having a multi-tier bonding pad structure in which pads to be connected to a semiconductor chip are arranged in multiple rows, comprises:

a row identifying means 11 for identifying each pad as to which row the pad belongs to;

a tentative placement means 12 for mapping the position of the pad to a position on a matrix table after the pad has been identified by the row identifying means 11 as to which row the pad belongs to; and a determining means 13 for determining the optimum wiring route based on the matrix table generated by the tentative placement means 12.

Here, based on the matrix table generated by the tentative placement means 12, the determining means 13 may determine a single-tier bonding pad arrangement in which the pads are arranged in a virtual manner in a single row. That is, once the single-tier bonding pad arrangement is obtained by the determining means 13, the optimum wiring route can be automatically selected by applying the technique described in Japanese Unexamined Patent Publication No. 2002-083006, so that an effect equivalent to that achieved by the automatic wiring apparatus 1 shown in FIG. 1 can be obtained.

In the present invention, the space between pads through which the wiring route can pass corresponds to the space between adjacent columns in the matrix table. The row identifying means 11, the tentative placement means 12, and the determining means 13 in the automatic wiring apparatus 1 are implemented in a software form that can be executed by a processing unit such as a computer.

The row identifying means 11 of FIG. 1 is also implemented as an automatic identifying apparatus as shown in FIG. 2 below, in a software form that can be executed by a processing unit such as a computer. FIG. 2 is a block diagram for explaining the basic principle of the automatic identifying apparatus according to the present invention.

The semiconductor package automatic identifying apparatus 2 which identifies the row to which each pad belongs on a semiconductor package having a multi-tier bonding pad structure in which pads to be connected to a semiconductor chip are arranged in multiple rows, comprises:

a first means 21 for drawing an auxiliary line on a virtual plane from each pad in a direction substantially parallel to a row direction; and a second means 22 for regarding a second pad, which the auxiliary line drawn from a first pad first crosses, as being a pad adjacent to the first pad and belonging to the same row as the first pad.

The determining means 13 of FIG. 1 is also implemented as an automatic wiring apparatus as shown in FIG. 3 below, in software form that can be executed by a processing unit such as a computer. FIG. 3 is a block diagram for explaining the basic principle (part 2) of the automatic wiring apparatus according to the present invention.

The semiconductor package automatic wiring apparatus 3 which determines an optimum wiring route from each pad to a corresponding one of vias on a semiconductor package having a multi-tier bonding pad structure in which pads to be connected to a semiconductor chip are arranged in multiple rows, comprises:

a candidate producing means 31 for producing, for each pad, a candidate for the wiring route from the pad to the via;

a judging means 32 for judging whether the wiring route crosses any other wiring route when the wiring route is laid from the pad to the via on a virtual plane in accordance with the wiring route candidate produced by the producing means 31;

a first determining means 33 for determining the wiring route candidate as being the optimum wiring route when it is judged by the judging means 32 that the wiring route does not cross any other wiring route; and a second determining means 34 for determining, between a plurality of wiring route candidates, a wiring route candidate that provides a wider clearance as being the optimum wiring route when it is judged by the judging means 32 that the wiring route crosses another wiring route.

In the above automatic wiring apparatus 3 also, when the optimum wiring route is obtained, a single-tier bonding pad arrangement, in which the pads are arranged in a virtual manner in a single row, may be determined as will be described with reference to FIG. 4 below. FIG. 4 is a block diagram for explaining the basic principle (part 3) of the automatic wiring apparatus according to the present invention.

The semiconductor package automatic wiring apparatus 4 which converts a multi-tier bonding pad arrangement, in which pads to be connected to a semiconductor chip are arranged in multiple rows on a semiconductor package, into a single-tier bonding pad arrangement, in which the pads are arranged in a virtual manner in a single row, comprises:

a candidate producing means 31 for producing, for each pad, a candidate for a wiring route from the pad to a via;

a judging means 32 for judging whether the wiring route crosses any other wiring route when the wiring route is laid from the pad to the via in accordance with the wiring route candidate produced by the producing means 31;

a first determining means 33 for determining the wiring route candidate as being the optimum wiring route when it is judged by the judging means 32 that the wiring route does not cross any other wiring route;

a second determining means 34 for determining, between a plurality of wiring route candidates, a wiring route candidate that provides a wider clearance as being the optimum wiring route when it is judged by the judging means 32 that the wiring route crosses another wiring route; and a mapping means 35 for newly mapping the position of the pad associated with the determined optimum wiring route to a position interposed between adjacent columns in a matrix table in which a pad-to-pad space through which the wiring route can pass on the semiconductor package corresponds to a space between the adjacent columns, the interposed position corresponding to a position between pads located in a prescribed row that the determined optimum wiring route crosses, wherein the apparatus determines the single-tier bonding pad arrangement with the pads arranged in a virtual manner in the prescribed row.

The candidate producing means 31, the judging means 32, the first determining means 33, and the second determining means 34 in the automatic wiring apparatus 4 in FIG. 4 are implemented in a software form that can be executed by a processing unit such as a computer.

Once the single-tier bonding pad arrangement is obtained by the above automatic wiring apparatus 4, the optimum wiring routes can be automatically laid by applying the technique described in Japanese Unexamined Patent Publication No. 2002-083006.

According to the present invention, which achieves the automatic wiring method and apparatus for automating wiring design for a semiconductor package having a multi-tier bonding pad structure, wiring routes of stable quality can be designed easily, and in a short period of time, without relying on the designer's skill, experience, intuition, etc. as in the prior art.

Further, according to the present invention, the multi-tier bonding pad arrangement can be converted into the single-tier bonding pad arrangement in which the pads are arranged in a virtual manner in a single row; therefore, once the conversion is done, the technique described in Japanese Unexamined Patent Publication No. 2002-083006 can be applied, and in this case also, the optimum wiring routes from the pads to the vias can be automatically determined.

Furthermore, according to the present invention, by using a processing unit, each pad in the multi-tier bonding pad arrangement can be automatically identified as to which row the pad belongs to.

BRIEF DESCRIPTION OF THE DRAWINGS

The present invention will be more clearly understood from the description as set forth below with reference to the accompanying drawings, wherein:

FIG. 12 is a diagram (part 2) for explaining the detailed processing of the row identifying step in the automatic wiring method according to the embodiment of the present invention;

FIGS. 22a to 22c are diagrams for explaining the case where the tentative placement step of the automatic wiring method according to the embodiment of the present invention is applied to a particular pad of a polygonal shape to which a plurality of wiring lines are connected;

FIG. 24 is a diagram for explaining how wiring lines can be routed from bonding pads to their corresponding vias without crossing;

FIGS. 29a and 29b are diagrams for explaining the detailed processing of the determining step in the automatic wiring method according to the embodiment of the present invention;

FIGS. 30a to 30c are diagrams showing, by way of example, the case where a multi-tier bonding pad arrangement is converted into a single-tier bonding pad arrangement based on a matrix table shown in FIGS. 29a and 29b;

FIGS. 31a and 31b are diagrams showing one example of the result obtained by performing the automatic wiring process for the multi-tier bonding pads according to the embodiment of the present invention;

FIG. 34 is a diagram showing by way of example the nets to be routed on a semiconductor package having a multi-tier bonding pad structure;

FIGS. 36a to 36d are diagrams (part 1) for explaining a variation of the wiring routing in the multi-tier bonding pad structure;

DESCRIPTION OF THE PREFERRED EMBODIMENTS

Figure 1:
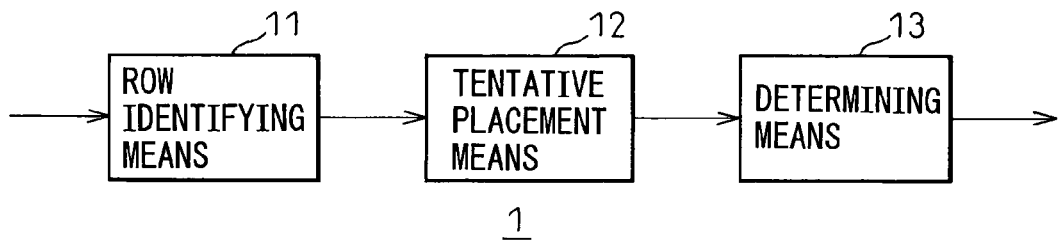
FIG. 1 is a block diagram for explaining the basic principle (part 1) of an automatic wiring apparatus according to the present invention.
Figure 2:
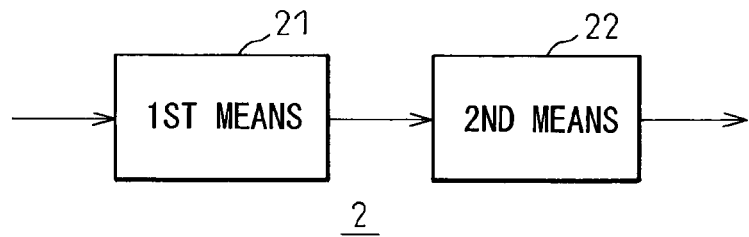
FIG. 2 is a block diagram for explaining the basic principle of an automatic identifying apparatus according to the present invention.
Figure 3:
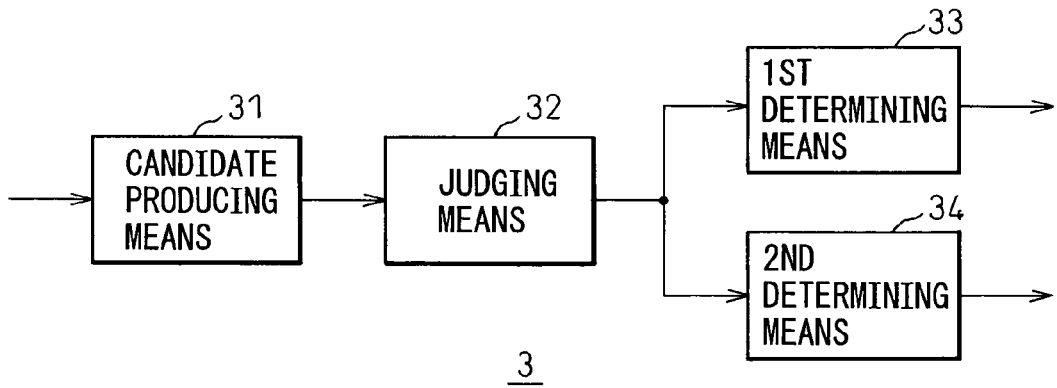
FIG. 3 is a block diagram for explaining the basic principle (part 2) of an automatic wiring apparatus according to the present invention.
Figure 4:
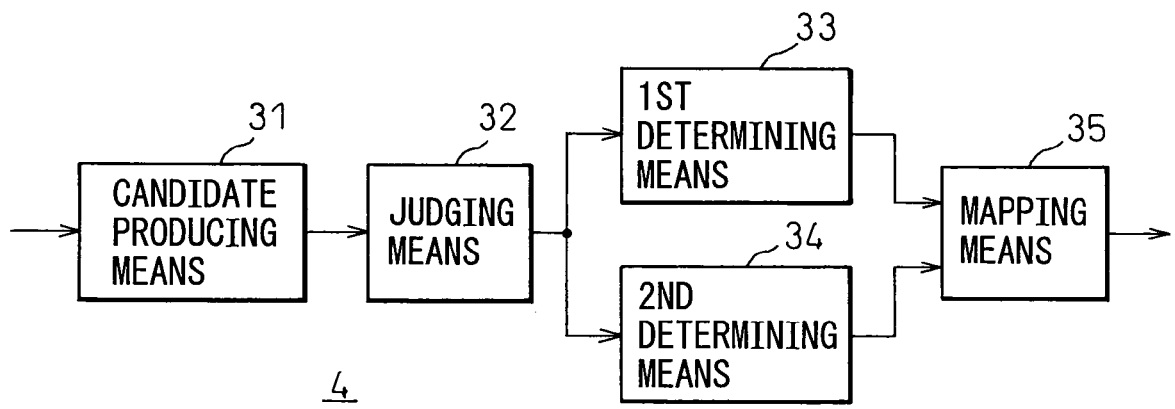
FIG. 4 is a block diagram for explaining the basic principle (part 3) of an automatic wiring apparatus according to the present invention.
Figure 5:
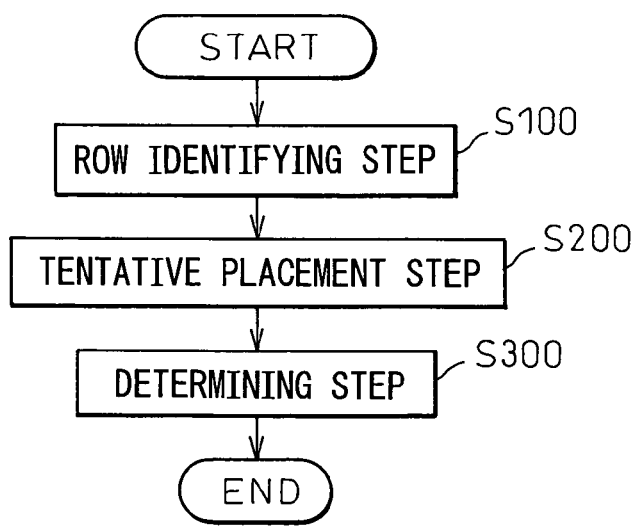
FIG. 5 is a flowchart illustrating the operation flow of an automatic wiring method according to an embodiment of the present invention.

FIG. 5 is a flowchart illustrating the operation flow of an automatic wiring method according to an embodiment of the present invention.

First, in a row identifying step S100, each pad in a multi-tier bonding pad arrangement, in which the pads to be connected to a semiconductor chip are arranged in multiple rows, is identified as to which row the pad belongs to. Next, in a tentative placement step S200, the position of each pad whose row has been identified in the row identifying step S100 is mapped to a position on a matrix table. In a determining step S300 that follows, an optimum wiring route from each pad to its corresponding via is determined based on the matrix table generated in the tentative placement step S200.

The row identifying step S100, the tentative placement step S200, and the determining step S300 in the automatic wiring method according to the embodiment of the present invention are carried out by a processing unit such as a computer. Here, prior to the execution of the row identifying step S100, data concerning such parameters as the coordinates, shape, size, and orientation of each of the multi-tier bonding pads and the coordinates, shape, size, and orientation of each via, and data concerning wiring from each chip pad on the semiconductor chip to the corresponding pad, are entered into the processing unit that carries out the automatic wiring method of the present invention. The processing unit carries out the row identifying process using the thus entered data in the row identifying step S100.

Figure 6:
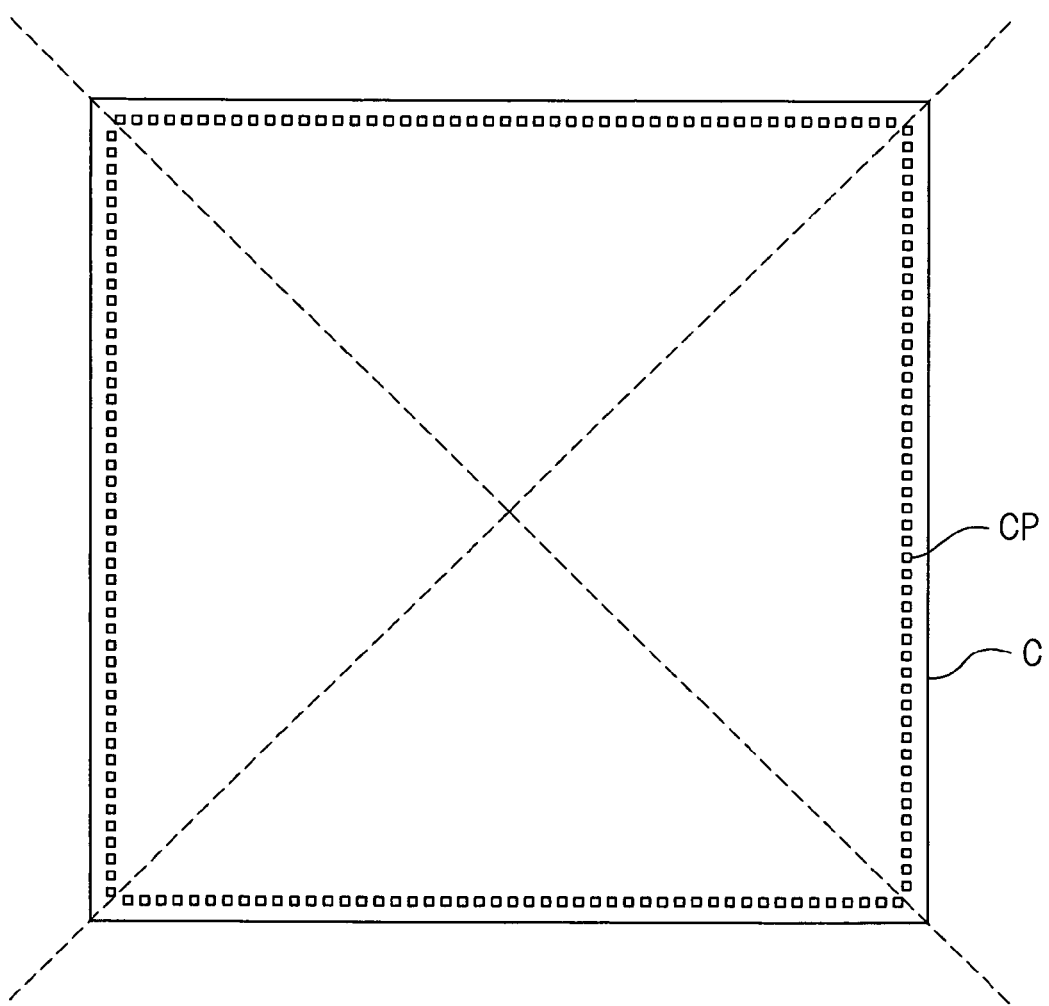
FIG. 6 is a diagram showing, by way of example, chip pads formed on a semiconductor chip.

FIG. 6 is a diagram showing, by way of example, the chip pads formed on the semiconductor chip. The semiconductor chip C is usually rectangular in shape, and the chip pads CP also are arranged so as to form a rectangle. As the multi-tier bonding pads (not shown) are placed at positions substantially corresponding to the chip pads CP, it follows that four groups of multi-tier bonding pads are formed on the substrate. The automatic wiring method of the present embodiment is carried out for each group of multi-tier bonding pads. Accordingly, on the CAD system side, the arrangement of the chip pads is divided into four groups on a virtual plane prior to the execution of the row identifying step. In the example shown in FIG. 6, the chip pads are divided into four groups by the diagonals (shown by dashed lines in the figure) of the semiconductor chip C. As the chip pads are connected to the bonding pads (the pads) by wires (wiring lines), if information about the groups of chip pads thus divided is available, the multi-tier bonding pads can be divided into four groups based on that information, and each bonding pad can be identified as to the group it belongs to.

Figure 7:
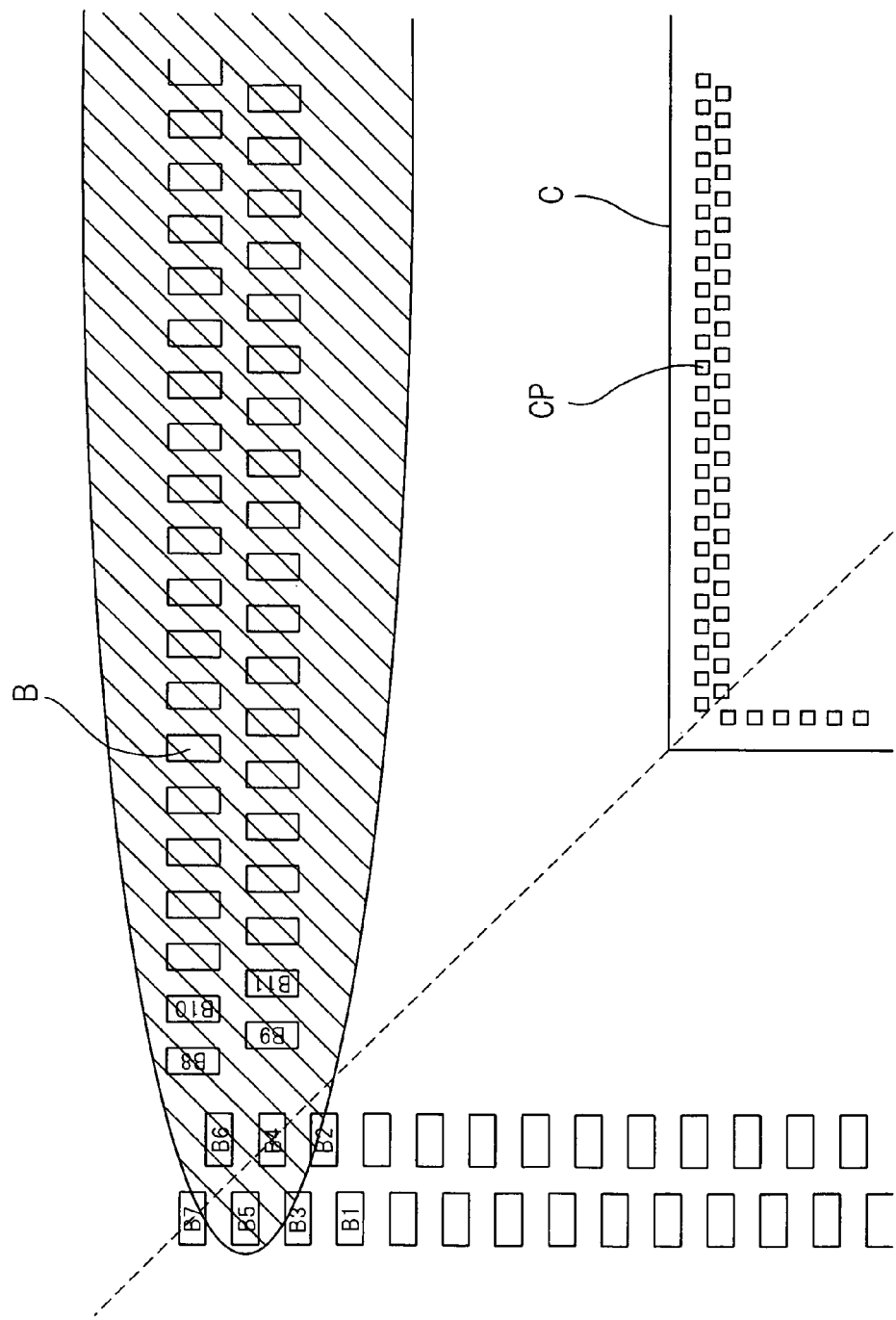
FIG. 7 is a diagram (part 1) for explaining how multi-tier bonding pads are divided into groups.
Figure 8:
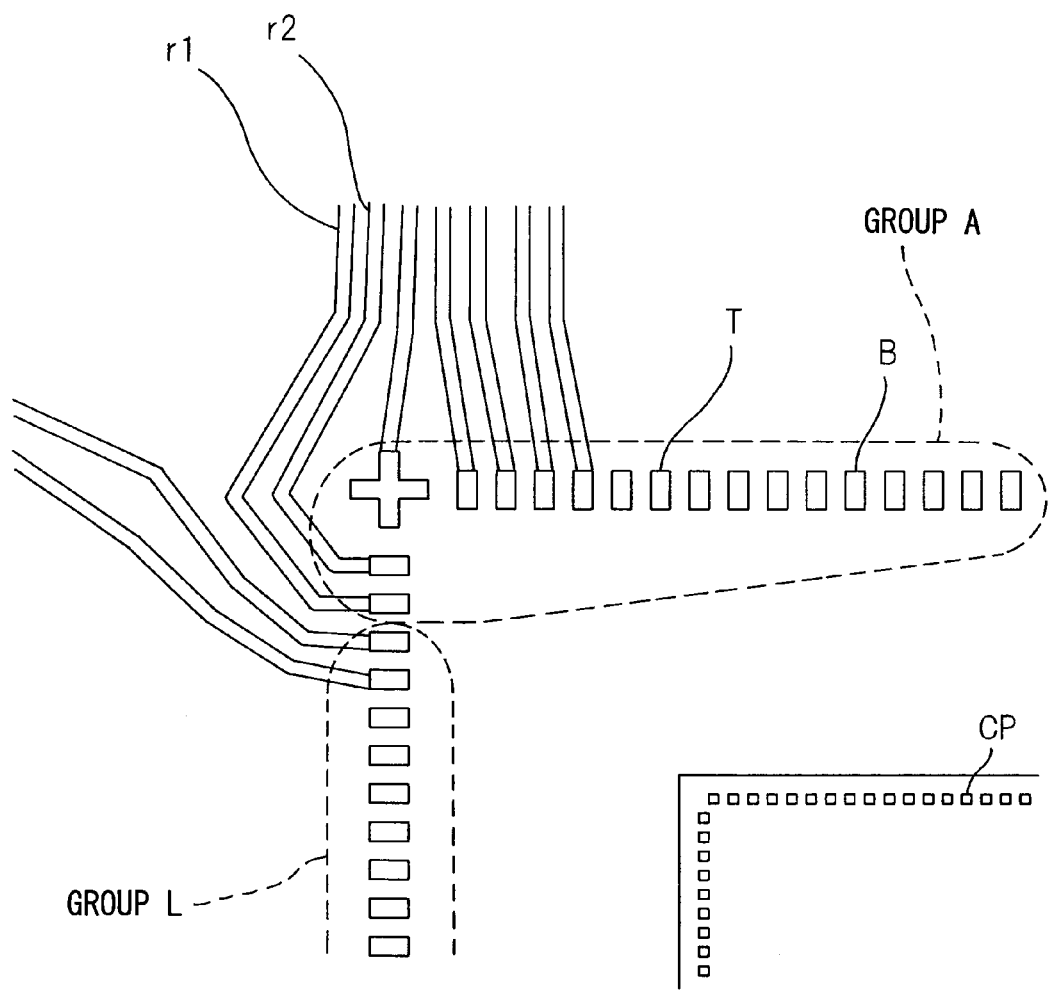
FIG. 8 is a diagram (part 2) for explaining how multi-tier bonding pads are divided into groups.

FIGS. 7 and 8 are diagrams for explaining how the multi-tier bonding pads are divided into groups. In the example of FIG. 6, the chip pads have been divided into groups by the diagonals (shown by dashed lines in the figure) of the semiconductor chip C but, depending on the particulars of the design, the diagonals may not be simply taken as the dividing lines. For example, in the case of FIG. 7 where it is desired to group the pads B within the shaded area into one group, the grouping of the pads B2 to B5 and B7 becomes a problem. An example of such a case is shown in FIG. 8 where the bonding pads to which the wiring routes r1 and r2 are connected need to be included in the group A, not the group L. In such a case, the wires should be traced back to check the positions of the chip pads, and the bonding pads should be manually divided into the desired groups.

After the multi-tier bonding pads on the substrate have been divided into groups as described above, the row identifying step S100, the tentative placement step S200, and the determining step S300 in FIG. 5 are carried out for each group.

First, the processing of the row identifying step will be described.

Figure 9:
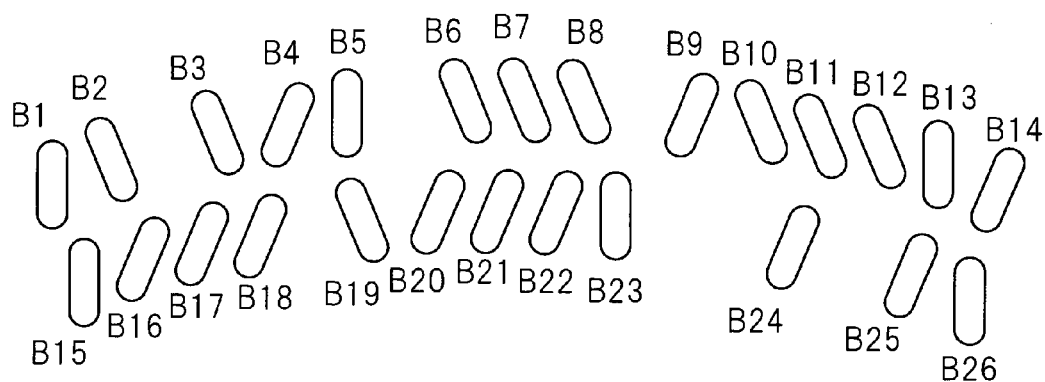
FIG. 9 is a diagram (part 1) for explaining the orientations of the pads in a multi-tier bonding pad arrangement.
Figure 10:
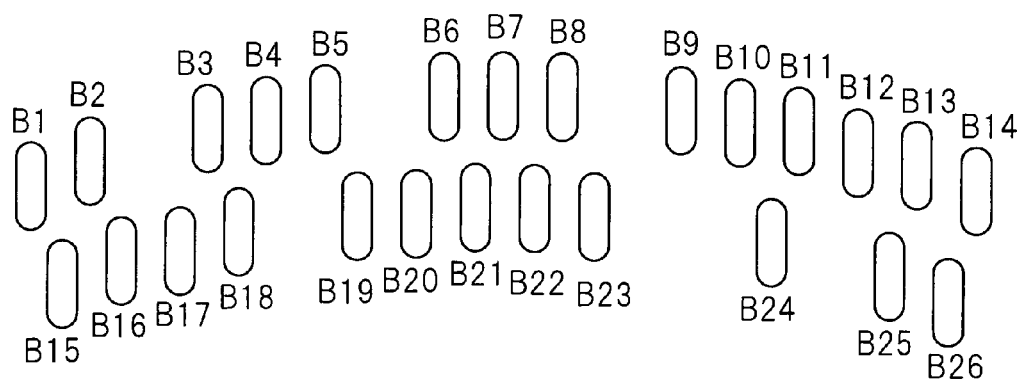
FIG. 10 is a diagram (part 2) for explaining the orientations of the pads in a multi-tier bonding pad arrangement.

FIGS. 9 and 10 are diagrams for explaining the orientations of the pads in a multi-tier bonding pad arrangement. In the figures, reference characters B1 to B26 are identification numbers assigned to the pads for convenience.

There are cases where the pads are oriented randomly, as illustrated in FIG. 9. In such cases, processing is performed to align the orientations of the pads on a virtual plane, as shown in FIG. 10. Here, the pads may be aligned, for example, in the same direction as the wiring direction.

Figure 11:
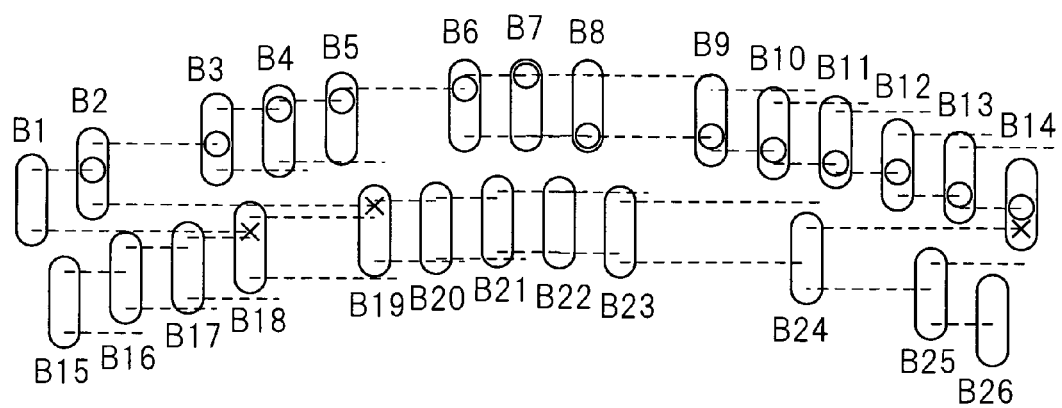
FIG. 11 is a diagram (part 1) for explaining the detailed processing of a row identifying step in the automatic wiring method according to the embodiment of the present invention.

FIGS. 11 and 12 are diagrams for explaining the detailed processing of the row identifying step in the automatic wiring method according to the embodiment of the present invention. In the figures, reference characters B1 to B26 are identification numbers assigned to the pads for convenience.

First, as illustrated in FIG. 11, for the multi-tier bonding pads where the pads to be connected to the semiconductor chip are arranged in multiple rows, straight auxiliary lines (shown by dashed lines in the figure) extending substantially parallel to the rows are drawn on the virtual plane. Preferably, at least two auxiliary lines are drawn from each pad.

When any one of the auxiliary lines thus drawn from a given pad (hereinafter referred to as the "first pad") first crosses another pad (hereinafter referred to as the "second pad"), this second pad is regarded as a pad adjacent to the first pad and belonging to the same row as the first pad. To describe more specifically by using the example of FIG. 11, the two auxiliary lines drawn from the pad B1, for example, cross the pads B2 and B18, but as the pad B2 is the first one that any one of the auxiliary lines from the pad B1 crosses, the pad B2 is regarded as a pad adjacent to the pad B1 and belonging to the same row as the pad B1. In another example, the two auxiliary lines drawn from the pad B2 cross the pads B3 and B19, but as the pad B3 is the first one that any one of the auxiliary lines from the pad B2 crosses, the pad B3 is regarded as a pad adjacent to the pad B2 and belonging to the same row as the pad B2. In still another example, the two auxiliary lines drawn from the pad B24 cross the pads B14 and B25, but as the pad B25 is the first one that any one of the auxiliary lines from the pad B24 crosses, the pad B25 is regarded as a pad adjacent to the pad B24 and belonging to the same row as the pad B24.

By performing the above processing for all the pads by using a computer, each of the multi-tier bonding pads can be automatically identified as to the row the pad belongs to. To describe more specifically, in the example of FIG. 11, the pads B1 to B14 are identified as belonging to the first row and the pads B15 to B26 as belonging to the second row, as shown in FIG. 12.

FIGS. 13a and 13b and FIGS. 14a and 14b are diagrams illustrating examples in which particular pads are larger than the other pads. In the figures, reference characters B1 to B4 are identification numbers assigned to the pads for convenience.

In a semiconductor package, when a plurality of wires (wiring lines) are connected to a certain pad, the pad is larger than a pad to which only one wire is connected. In this case, if the row identifying process described with reference to FIGS. 11 and 12 is performed, the larger pad, because of its size, may be identified as belonging to more than one row when it actually belongs to only one row.

Figure 13A:
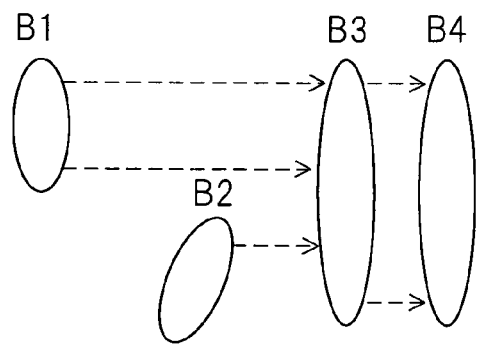
FIGS. 13a and 13b are diagrams (part 1) illustrating examples in which particular pads are larger than the other pads.
Figure 13B:
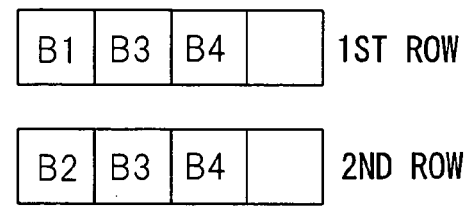
Figure 14A:
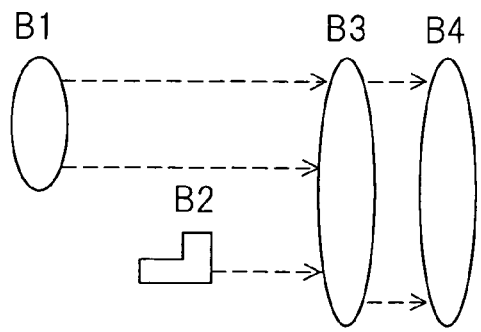
FIGS. 14a and 14b are diagrams (part 2) illustrating examples in which particular pads are larger than the other pads.
Figure 14B:
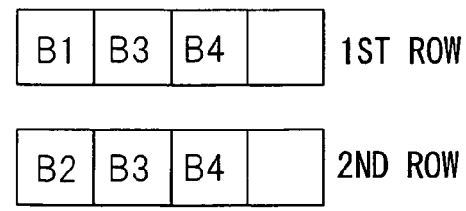

To describe this more specifically by using the examples shown in FIGS. 13a and 13b and FIGS. 14a and 14b, the two auxiliary lines drawn from the pad B1 cross the pad B3, and the two auxiliary lines drawn from the pad B3 cross the pad B4, as shown in FIG. 13a or 14a. On the other hand, the two auxiliary lines drawn from the pad B2 cross the pad B3, and the two auxiliary lines drawn from the pad B3 cross the pad B4. As a result, the pads B1, B3, and B4 are identified as belonging to the first row and the pads B2 to B4 as belonging to the second row, as shown in FIG. 13b or 14b. In this way, as the pads B3 and B4, which are larger than the pads B1 and B2, are each identified as belonging to the two rows, correct row identification results cannot be obtained.

Therefore, to obtain correct row identification results, the present embodiment further performs the following process in the row identifying step. First, it is judged whether there is any pad that has been identified as belonging to at least two rows in the row identifying process described with reference to FIGS. 11 and 12. Here, any pad that has been judged to belong to at least two rows is regarded as belonging to either one of the at least two rows. Then, from the pad that has been judged to belong to at least two rows, a straight auxiliary line (hereinafter referred to as the "reverse auxiliary line") is drawn on the virtual plane in the direction opposite to the direction of the auxiliary lines drawn in FIG. 11. Then, the ordering of the pads that the reverse auxiliary line has crossed is recorded. In the present embodiment, such processing is called the "reverse search". The recorded result from the reverse search process is used for the generation of the matrix table to be described later; an explanation of how this is done will be given later in connection with the tentative placement step.

Figure 15A:
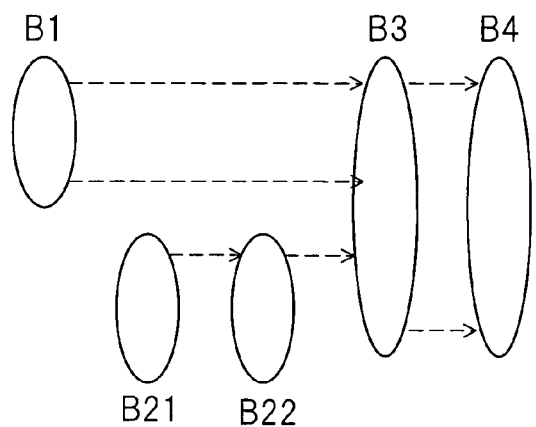
FIGS. 15a to 15c are diagrams for explaining the detailed processing of a reverse search performed when particular pads are larger than the other pads in the row identifying step of the automatic wiring method according to the embodiment of the present invention.
Figure 15B:
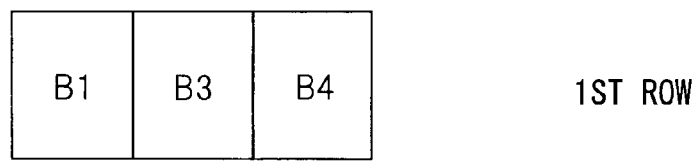
Figure 15C:
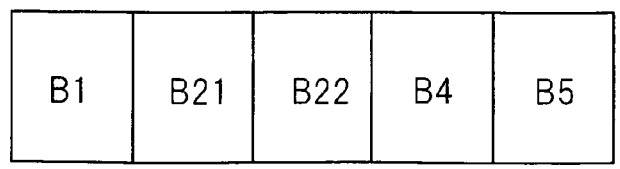

FIGS. 15a to 15c are diagrams for explaining the detailed processing of the reverse search performed when particular pads are larger than the other pads in the row identifying step of the automatic wiring method according to the embodiment of the present invention. In the figures, reference characters B1, B3, B4, B21, and B22 are identification numbers assigned to the pads for convenience.

When the pads B1, B3, B4, B21, and B22 are arranged as shown in FIG. 15a, if the row identifying process explained with reference to FIGS. 11 and 12 is performed, the pads B1, B3, and B4 are identified as belonging to the first row and the pads B21, B22, B3, and B4 as belonging to the second row, as shown in FIG. 15b. That is, the pads B3 and B4 larger than the pads B1, B21 and B22 are each identified as belonging to two rows. Here, the pads B3 and B4 are regarded as belonging to the first row which is the same row as the pad B1. Then, the reverse search is performed, and the ordering of the pads that the reverse auxiliary line has crossed is recorded. In this example, the order of "B5", "B4", "B22", "B21", and "B1" is obtained from the reverse auxiliary line, and this arrangement order is recorded as shown in FIG. 15c. As a result of the reverse search, it can be seen that, when viewed in the row direction, the pads B21 and B22 are located somewhere between the pad B1 and the pad B3. The result obtained here is used when generating the matrix table.

Figures 16A, 16B:
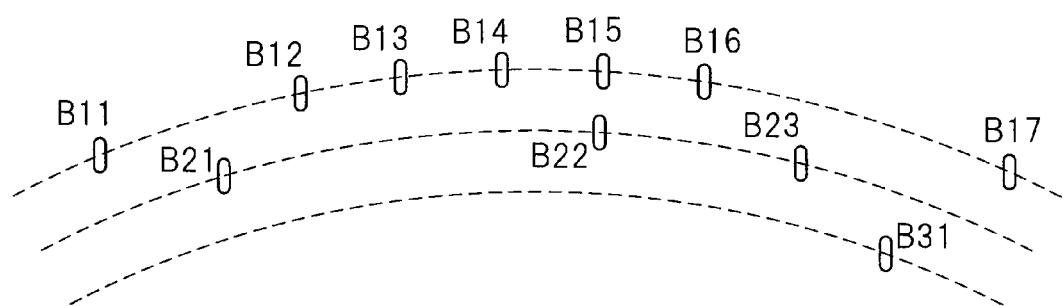
FIGS. 16a and 16b are diagrams showing one example of the result obtained by performing the row identifying step of the automatic wiring method according to the embodiment of the present invention for the multi-tier bonding pads arranged in three rows as shown in FIG. 44.
Figure 44:
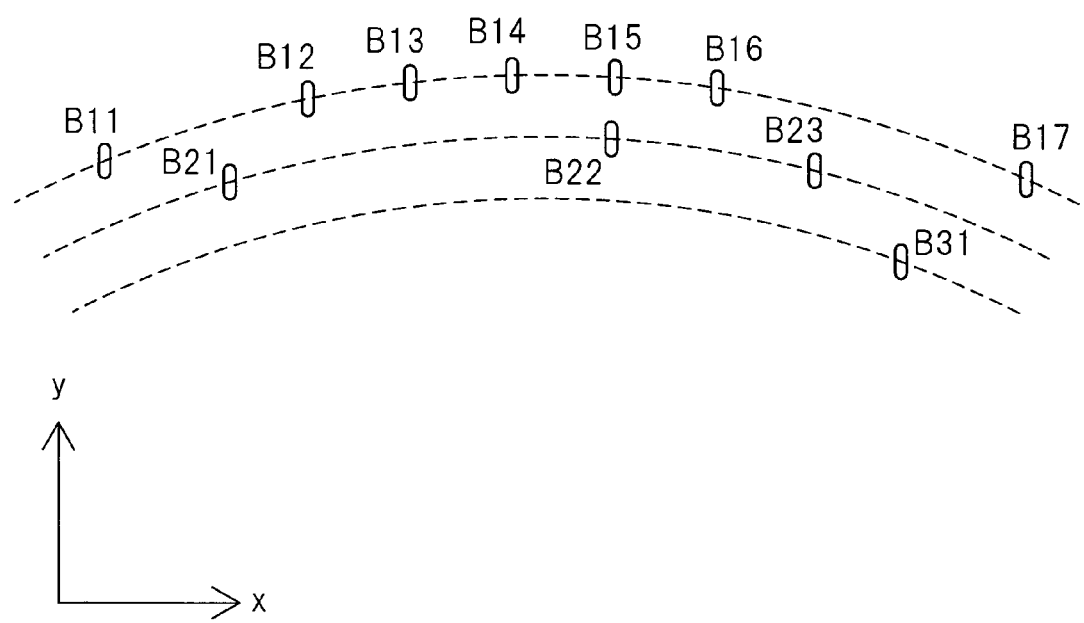
FIG. 44 is a diagram showing the bonding pads arranged in three rows as an example of the multi-tier bonding pad arrangement.

FIGS. 16a and 16b are diagrams showing one example of the result obtained by performing the row identifying step of the automatic wiring method according to the embodiment of the present invention for the multi-tier bonding pads arranged in three rows as shown in FIG. 44. In the figures, reference characters B11 to B17, B21 to B23, and B31 are identification numbers assigned to the pads for convenience, and FIG. 16a shows the same diagram as FIG. 44. When the row identifying step of this embodiment is performed, the pads B11 to B17 are identified as belonging to the first row, the pads B21 to B23 to the second row, and the pad B31 to the third row, as shown in FIG. 16b.

In this way, by performing the above processing in the row identifying step for all the pads by using a computer, each of the multi-tier bonding pads can be identified, automatically and computationally, as to the row the pad belongs to. This row identifying step may be used by itself as an automatic identifying method for identifying each of the multi-tier bonding pads as to the row the pad belongs to.

Next, the processing of the tentative placement step will be described.

In the present embodiment, the multi-tier bonding pad arrangement, in which the pads to be connected to the semiconductor chip are arranged in multiple rows, is expressed in the form of a matrix table such that the space between adjacent columns corresponds to the space between pads through which a wiring route can pass, and the optimum wiring route from each pad to its corresponding via is determined based on this matrix table. In the tentative placement step, the position of each pad whose row has been identified in the above row identifying step is mapped to a position on the matrix table.

Figure 17:
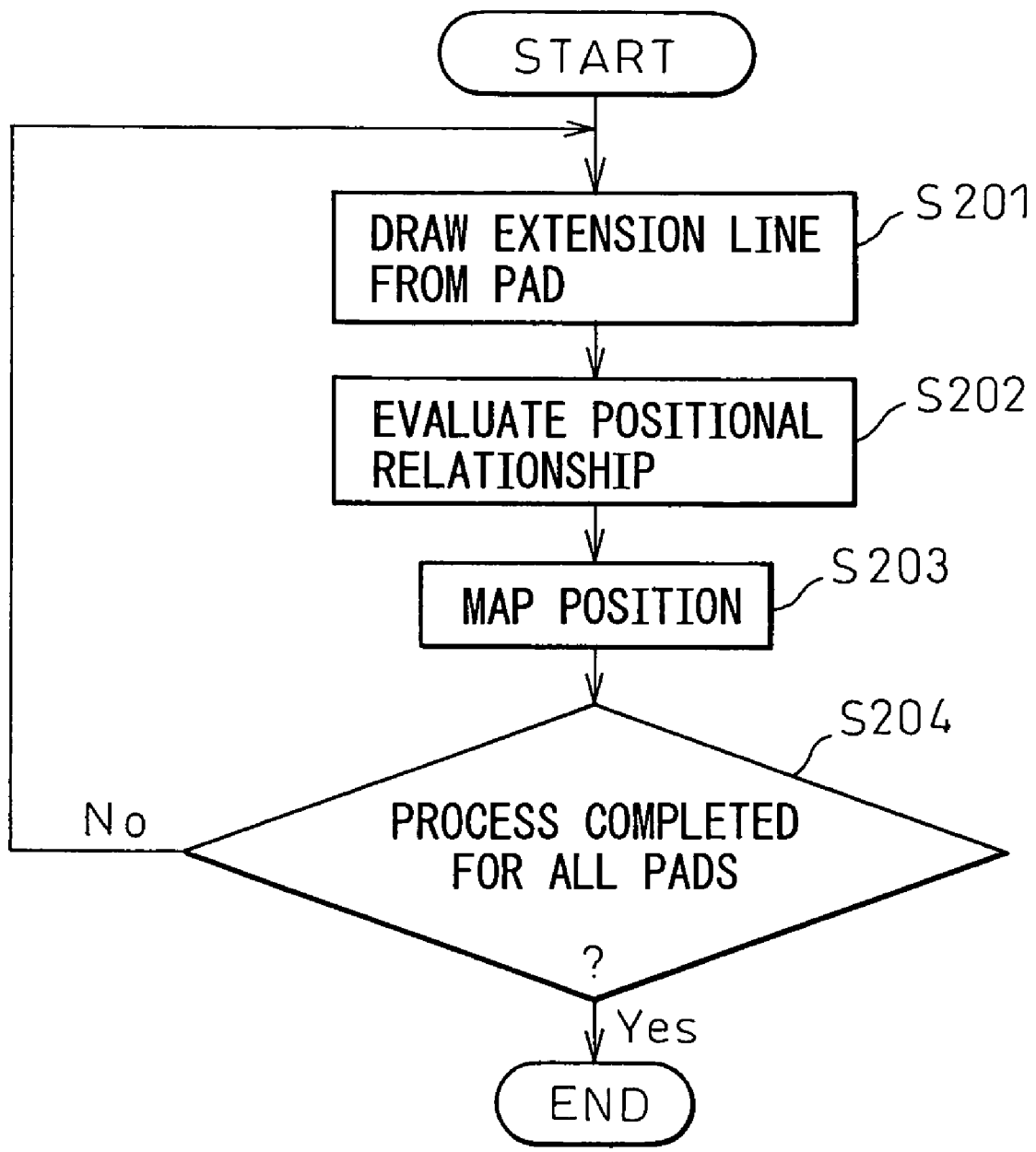
FIG. 17 is a flowchart illustrating the operation flow of a tentative placement step in the automatic wiring method according to the embodiment of the present invention.

FIG. 17 is a flowchart illustrating the operation flow of the tentative placement step in the automatic wiring method according to the embodiment of the present invention.

First, in step S201, for each pad whose row has been identified in the above row identifying step, a straight extension line is drawn on the virtual plane from the pad in the direction in which the wiring line is routed from the semiconductor chip to the pad or in the direction in which the pad is oriented.

Next, in step S202, the positional relationship is evaluated between the extension line drawn from each pad belonging to the first row and each pad belonging to the second row adjacent to the first row.

In the next step S203, if it is determined in step S202 that the extension line crosses any pad belonging to the second row, the position on the matrix table of the pad belonging to the first row is mapped to the same column as the pad belonging to the second row; on the other hand, if it is determined in step S202 that the extension line passes through the space between two pads belonging to the second row, the position on the matrix table of the pad belonging to the first row is mapped to the column located between the two pads. Here, the space between pads through which a wiring route can pass on the virtual plane corresponds to the space between adjacent columns in the matrix table.

In step S204, it is determined whether the above steps S201 to S203 have been performed for all the pads.

With the above processing, the multi-tier bonding pads are tentatively placed on the virtual plane by mapping the position of each pad to the corresponding position on the matrix table. It can be said that the extension line drawn from each pad on the virtual plane so as to coincide with the direction of the wiring to the pad is pointing to the direction of the wiring route intended by the designer. Accordingly, each pad position on the matrix table generated by using the extension line as described above can be regarded as reflecting the designer's design intent.

A further detailed description will be given with reference to FIGS. 18a and 18b, FIGS. 19a and 19b, and FIGS. 20a and 20b. FIGS. 18a and 18b, FIGS. 19a and 19b, and FIGS. 20a and 20b are diagrams for explaining the detailed processing of the tentative placement step in the automatic wiring method according to the embodiment of the present invention. In the figures, reference characters B1 to B3 are identification numbers assigned to the pads for convenience.

Figure 18A:
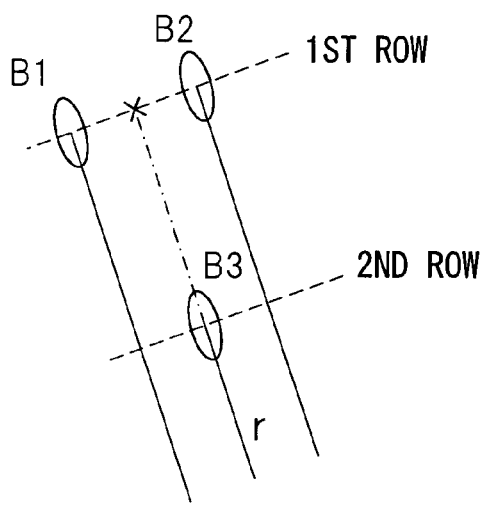
FIGS. 18a and 18b are diagrams (part 1) for explaining the detailed processing of the tentative placement step in the automatic wiring method according to the embodiment of the present invention.
Figure 18B:
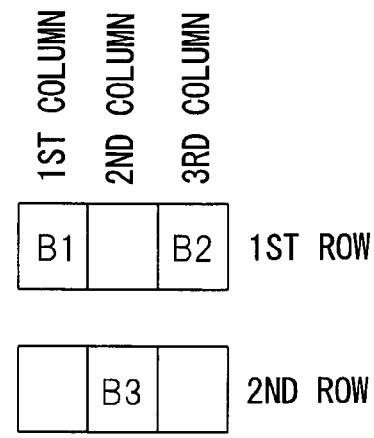

For example, when the pads B1 and B2 belong to the first row and the pad B3 belongs to the second row, as shown in FIG. 18a, a straight extension line (shown by a semi-dashed line in the figure) is drawn on the virtual plane from the pad B3 belonging to the second row in such a manner as to extend in the direction in which the wiring line (wire) r is routed from the semiconductor chip to the pad B3 or in the direction in which the pad B3 is oriented. The extension line drawn from the pad B3 belonging to the second row crosses the first row adjacent to the second row, at position "x" shown in the figure. That is, it can be seen that the extension line passes through a point between the pads B1 and B2 belonging to the first row. Accordingly, on the matrix table, it is determined that the column in which the pad B3 belonging to the second row is contained is one that is located between the pads B1 and B2 belonging to the first row, as shown in FIG. 18b. More specifically, on the matrix table, if the pad B1 is located in the first row and the first column and the pad B2 in the first row and the third column, then the pad B3 is located in the second row and the second column.

Figure 19A:
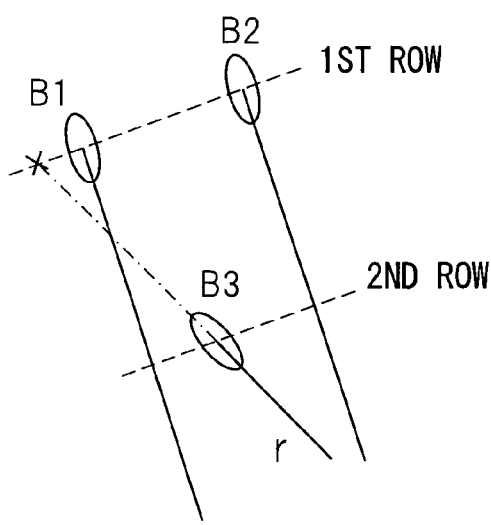
FIGS. 19a and 19b are diagrams (part 2) for explaining the detailed processing of the tentative placement step in the automatic wiring method according to the embodiment of the present invention.

On the other hand, when the pads B1 and B2 belong to the first row and the pad B3 belongs to the second row, for example, as shown in FIG. 19a, an extension line (shown by a semi-dashed line in the figure) is drawn on the virtual plane from the pad B3 belonging to the second row in such a manner as to extend in the direction in which the wiring line (wire) r is routed or in the direction in which the pad B3 is oriented.

Figure 19B:
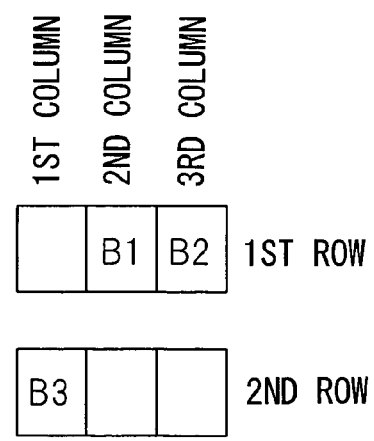

The extension line drawn from the pad B3 belonging to the second row crosses the first row adjacent to the second row, at position "x" shown in the figure. That is, it can be seen that the extension line passes through a point located on the opposite side of the pad B1 from the pad B2 in the first row. Accordingly, on the matrix table, it is determined that the column in which the pad B3 belonging to the second row is contained is one that is located on the opposite side of the pad B1 from the pad B2 in the first row, as shown in FIG. 19b. More specifically, on the matrix table, if the pad B1 is located in the first row and the second column and the pad B2 in the first row and the third column, then the pad B3 is located in the second row and the first column.

Figure 20A:
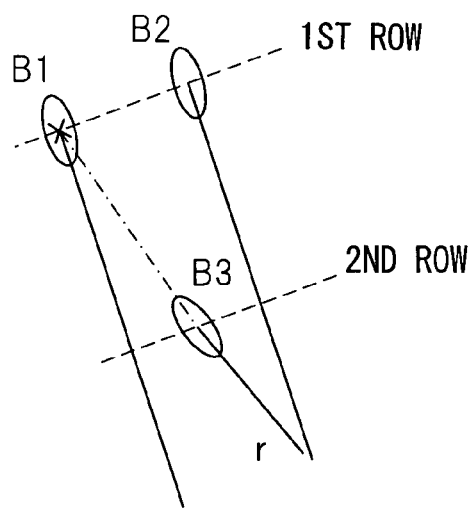
FIGS. 20a and 20b are diagrams (part 3) for explaining the detailed processing of the tentative placement step in the automatic wiring method according to the embodiment of the present invention.
Figure 20B:
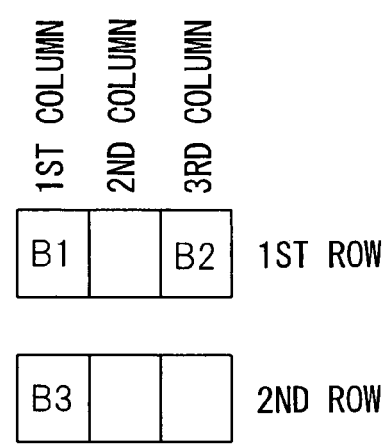

Further, when the pads B1 and B2 belong to the first row and the pad B3 belongs to the second row, for example, as shown in FIG. 20a, an extension line (shown by a semi-dashed line in the figure) is drawn on the virtual plane from the pad B3 belong to the second row in such a manner as to extend in the direction in which the wiring line (wire) r is routed or in the direction in which the pad B3 is oriented. The extension line drawn from the pad B3 belonging to the second row crosses the first row adjacent to the second row, at position "x" shown in the figure. That is, the extension line crosses the pad B1 located in the first row. Accordingly, on the matrix table, it is determined that the pad B3 belonging to the second row is contained in the same column as the pad B1 belonging to the first row, as shown in FIG. 20b. More specifically, on the matrix table, if the pad B1 is located in the first row and the first column and the pad B2 in the first row and the third column, then the pad B3 is located in the second row and the first column.

In the specific examples shown in FIGS. 18a and 18b, FIGS. 19a and 19b, and FIGS. 20a and 20b above, the direction in which the pad is oriented is the same as the direction in which the wiring line (wire) is routed to the pad, but there are certain cases where the former direction does not coincide with the latter direction. In such cases, it is preferable to draw the straight extension line in the direction in which the wiring line is routed.

Figure 21A:
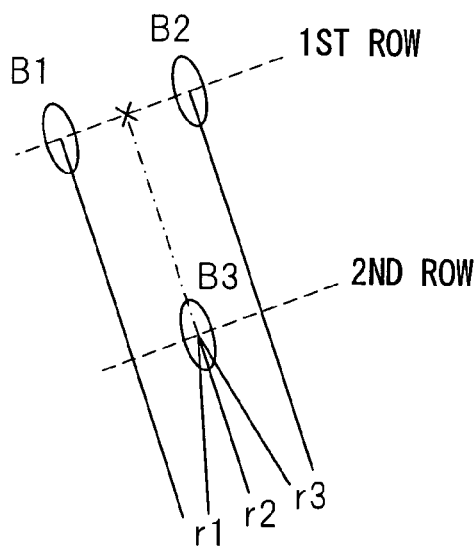
FIGS. 21a and 21b are diagrams for explaining the case where the tentative placement step of the automatic wiring method according to the embodiment of the present invention is applied to a particular pad to which a plurality of wiring lines are connected.
Figure 21B:
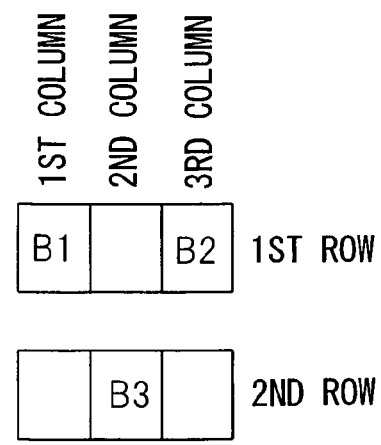

There are also cases where a plurality of wiring lines are connected to the pad. In such cases, it is preferable to draw the straight extension line in the direction in which the pad is oriented; this will be explained in further detail below with reference to FIGS. 21a and 21b. FIGS. 21a and 21b are diagrams for explaining the case where the tentative placement step of the automatic wiring method according to the embodiment of the present invention is applied to a particular pad to which a plurality of wiring lines are connected. In the figures, reference characters B1 to B3 are identification numbers assigned to the pads for convenience.

As shown in FIG. 21a, when the pads B1 and B2 belong to the first row and the pad B3 belongs to the second row, and when three wiring lines (wires) r1, r2, and r3 are connected to the pad B3, a straight extension line (shown by a semi-dashed line in the figure) is drawn on the virtual plane from the pad B3 in such a manner as to extend in the direction in which the pad B3 is oriented. The extension line drawn from the pad B3 belonging to the second row crosses the first row adjacent to the second row, at position "x" shown in the figure. That is, the extension line passes through a point between the pads B1 and B2 belonging to the first row. Accordingly, on the matrix table, it is determined that the column in which the pad B3, belonging to the second row is contained is one that is located between the pads B1 and B2 belonging to the first row, as shown in FIG. 21b. More specifically, on the matrix table, if the pad B1 is located in the first row and the first column and the pad B2 in the first row and the third column, then the pad B3 is located in the second row and the second column.

There are also cases where a plurality of wiring lines are connected to a polygonal-shaped pad. For example, the pad to which a plurality of wiring lines are connected may be made polygonal in shape to provide necessary clearance from the surroundings. In such cases, if there are an odd number of wiring lines connected to the polygonal-shaped pad, it is preferable to draw the straight extension line in the direction in which, of the odd number of wiring lines, the wiring line located in the center is routed, while if there are an even number of wiring lines connected to the polygonal-shaped pad, it is preferable to draw the straight extension line as a midline passing through a midpoint between the outermost wiring lines of the even number of wiring lines; this will be explained in further detail below with reference to FIGS. 22a to 22c. FIGS. 22a to 22c are diagrams for explaining the case where the tentative placement step of the automatic wiring method according to the embodiment of the present invention is applied to a particular pad of a polygonal shape to which a plurality of wiring lines are connected. In the figures, reference characters B1 to B6 are identification numbers assigned to the pads for convenience, and reference characters r1 to r4 are identification numbers assigned to the wiring routes for convenience.

As shown in FIG. 22a, it is assumed that the pads B2 and B5 are polygonal in shape, and that four wiring lines (wires) r1 to r4 from the semiconductor chip are connected to the pad B2, while three wiring lines r5 to r7 from the semiconductor chip are connected to the pad B5. At this time, an extension line is drawn from the pad B2 on the virtual plane so as to coincide with a midline (shown by a semi-dashed line in the figure) passing through a midpoint between the outermost wiring lines r1 and r4 of the four wiring lines r1 to r4. On the other hand, from the pad B5 on the virtual plane, an extension line is drawn in the direction in which the wiring line r6 located in the center of the group of the three wiring lines r5 to r7 is routed (as shown by a semi-dashed line in the figure). As shown in FIG. 22b, the extension lines drawn from the pads B2 and B5 respectively cross the first row at positions "x" shown in the figure. That is, on the virtual plane, the extension line drawn from the pad B2 passes through a point between the pads B1 and B3 in the first row, while the extension line drawn from the pad B5 passes through a point between the pads B4 and B6 in the first row. Accordingly, on the matrix table, it is determined, as shown in FIG. 22c, that the column in which the pad B2 belonging to the second row is contained is one that is located between the pads B1 and B3 belonging to the first row, and that the column in which the pad B5 belonging to the second row is contained is one that is located between the pads B4 and B6 belonging to the first row. More specifically, on the matrix table, if the pad B1 is located in the first row and the first column, the pad B3 in the first row and the third column, the pad B4 in the first row and the fourth column, and the pad B6 in the first row and the sixth column, then the pad B2 is located in the second row and the second column, while the pad B5 is located in the second row and the fifth column.

In this way, by performing the above processing in the tentative placement step for all the pads by using a computer, the positions of the multi-tier bonding pads are tentatively placed on the matrix table.

Figures 23A, 23B:
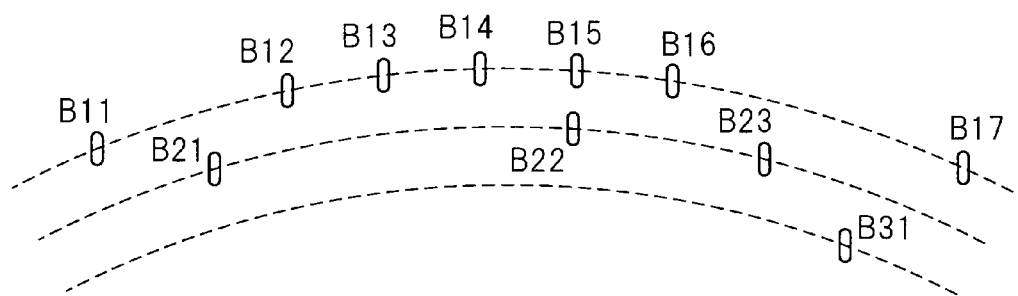
FIGS. 23a and 23b are diagrams showing one example of the result obtained by performing the tentative placement step of the automatic wiring method according to the embodiment of the present invention for the multi-tier bonding pads arranged in three rows as shown in FIG. 44.

FIGS. 23a and 23b are diagrams showing one example of the result obtained by performing the tentative placement step of the automatic wiring method according to the embodiment of the present invention for the multi-tier bonding pads arranged in three rows as shown in FIG. 44. In the figures, reference characters B11 to B17, B21 to B23, and B31 are identification numbers assigned to the pads for convenience, and FIG. 23a shows the same diagram as FIG. 44. By performing the tentative placement step of this embodiment, the matrix table such as shown in FIG. 23b can be generated.

As previously described with reference to FIGS. 13a and 13b, FIGS. 14a and 14b, and FIGS. 15a to 15c, the reverse search is performed in order to obtain correct row identification results when a larger pad is included; in this case, the final matrix table is generated by considering the row identification results obtained by the reverse search.

Next, the processing of the determining step will be described.

In the determining step of the present embodiment, the optimum wiring route from each pad to its corresponding via is determined based on the matrix table in which the positions of the multi-tier bonding pads have been mapped in the tentative placement step.

In the present embodiment, as the positions of the multi-tier bonding pads can be objectively grasped by using the matrix table, a wiring design process that involves producing possible wiring route candidates based on the matrix table, and selecting from among the candidates a wiring route that does not cross any other wiring route, can be implemented by a computer.

Generally, when a wiring line is routed from a pad to a via, if the wiring line does not cross any other wiring line, then the wiring route can be said to be an ideal one. FIG. 24 is a diagram for explaining how wiring lines can be routed from the bonding pads to their corresponding vias without crossing each other.

Figure 25:
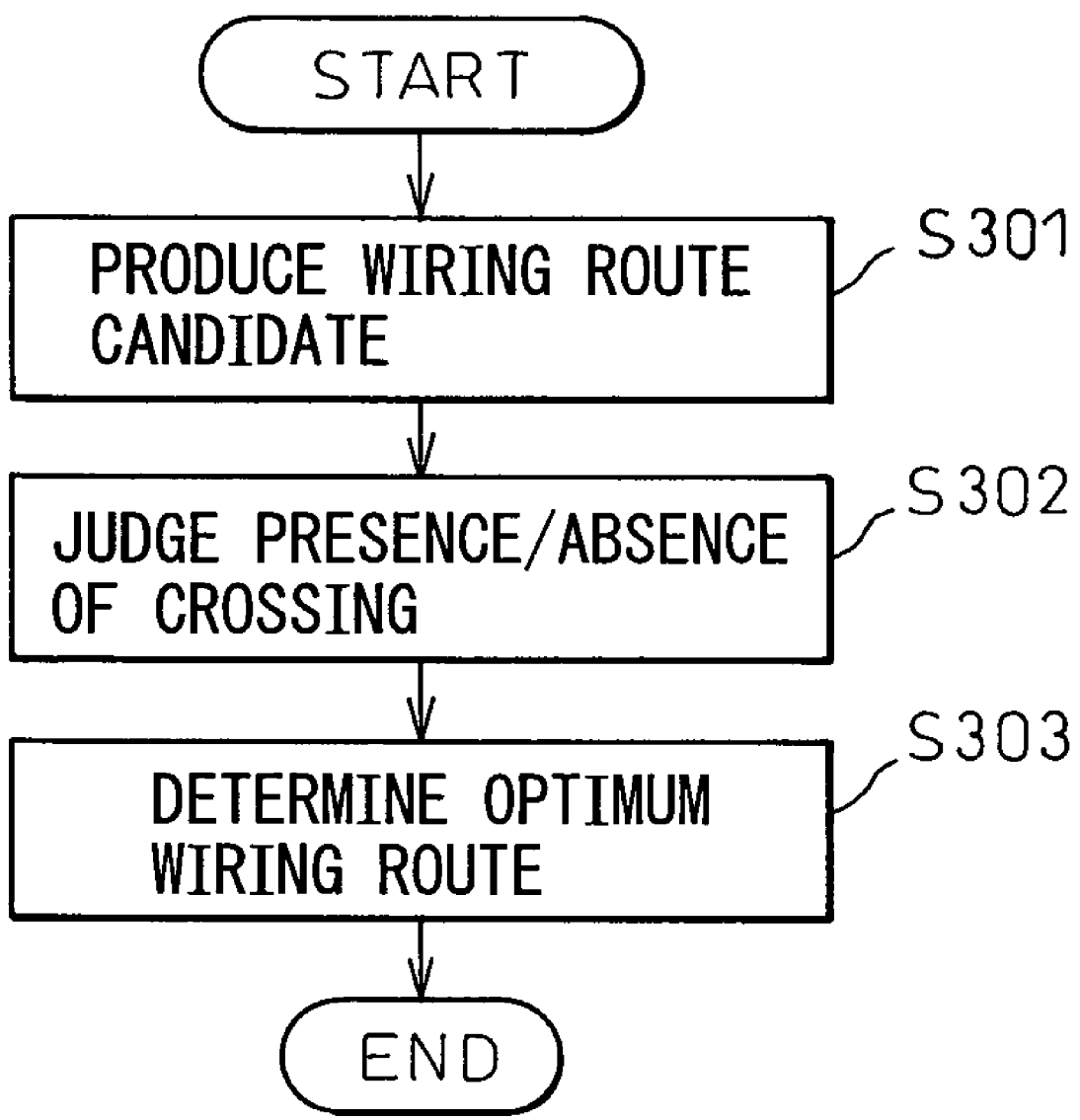
FIG. 25 is a flowchart illustrating the operation flow of a determining step in the automatic wiring method according to the embodiment of the present invention.

FIG. 25 is a flowchart illustrating the operation flow of the determining step in the automatic wiring method according to the embodiment of the present invention.

First, in step S301, for each pad, candidates for the wiring route from the pad to its corresponding via are produced based on the matrix table generated in the tentative placement step described above.

Next, in step S302, each wiring route candidate is evaluated to determine whether the wiring route crosses any other wiring route when it is laid from the pad to the via on the virtual plane.

In step S303, if it is determined in step S302 that there is a wiring route candidate that does not cross any other route, then the wiring route candidate is determined as being an ideal wiring route; on the other hand, if it is determined in step S302 that there are no wiring route candidates that do not cross any other route then, among the wiring route candidates, the wiring route candidate that provides the wider clearance is selected, and the selected wiring route candidate is determined as being an ideal wiring route.

Here, the crossing presence/absence judgment performed in step S302 will be described in further detail. FIGS. 26a and 26b, FIG. 27, and FIG. 28 are diagrams for explaining the detailed processing of the crossing presence/absence judgment performed in the tentative placement step of the automatic wiring method according to the embodiment of the present invention. FIGS. 26a and 26b, FIG. 27, and FIG. 28 consider the case where wiring lines are connected from the pad B1 to the via V1, from the pad B2 to the via V2, and from the pad B3 to the via V3, respectively.

Figure 26A:
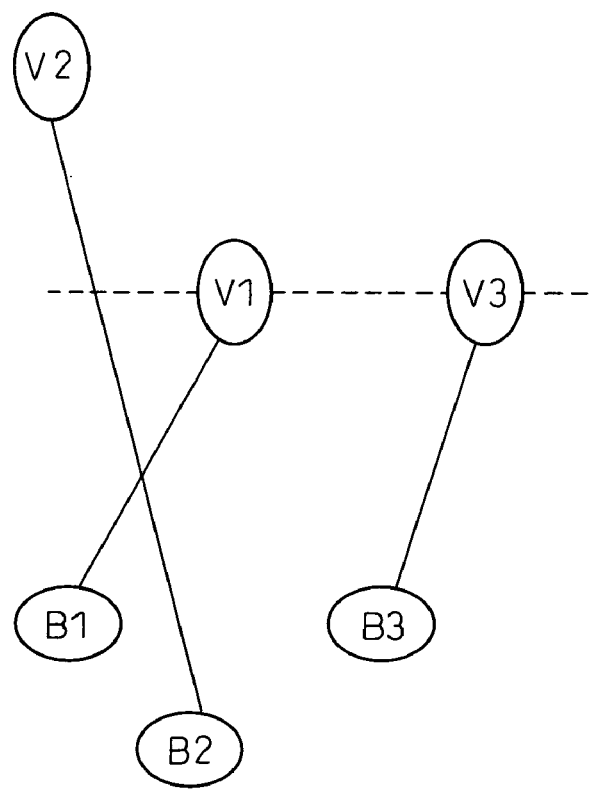
FIGS. 26a and 26b are diagrams (part 1) for explaining the detailed processing of the crossing presence/absence judgment performed in the tentative placement step of the automatic wiring method according to the embodiment of the present invention.
Figure 26B:
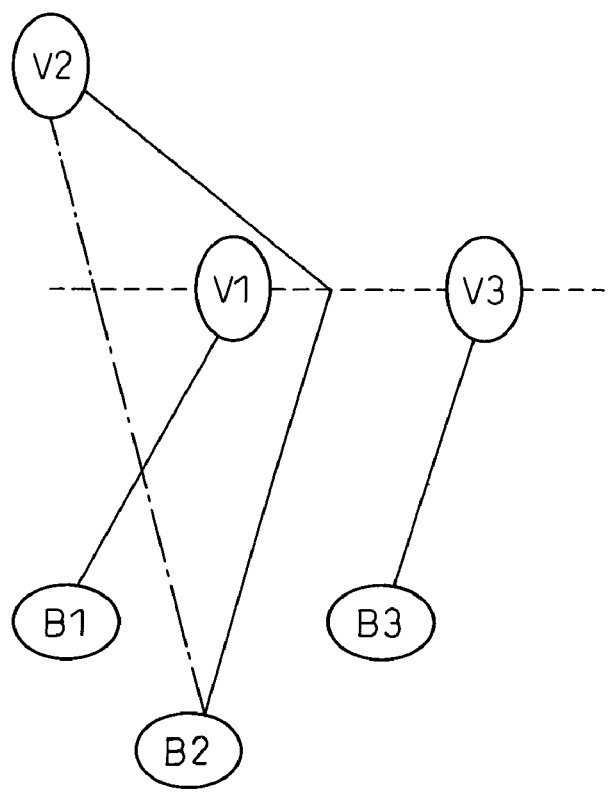

For example, when the vias V1 and V3 are located on a straight auxiliary line (shown by a dashed line in the figure, hereinafter referred to as the "crossing detecting auxiliary line"), and only the via V2 is not located on the crossing detecting auxiliary line, as shown in FIG. 26a, if a crossing occurs between the wiring line from the pad B1 to the via V1 and the wiring line from the pad B2 to the via V2, the crossing of the wiring line can be avoided by rerouting the wiring line from the pad B2 to the via V2 (shown by a semi-dashed line in FIG. 26b) so as to circumvent the via V1 (as shown by a solid line in FIG. 26b). That is, any crossing that may occur between the wiring lines to be connected to vias not located on the same crossing detecting auxiliary line can be avoided without fail by ingeniously planning the routing. In other words, this condition can be regarded as a condition that does not cause any crossing between wiring lines. In this case, when actually determining the wiring route, the wiring line rerouted so as to avoid the crossing is selected.

Figure 27:
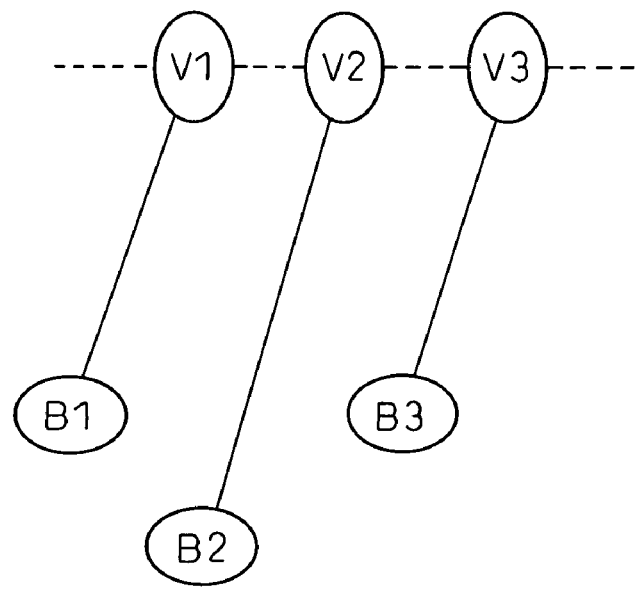
FIG. 27 is a diagram (part 2) for explaining the detailed processing of the crossing presence/absence judgment performed in the tentative placement step of the automatic wiring method according to the embodiment of the present invention.

Further, for example, when the vias V1, V2, and V3 are all located on the crossing detecting auxiliary line, and when the pads B1 to B3 and their corresponding vias V1 to V3 are respectively arranged in the same direction and in the same order, as shown in FIG. 27, there can occur no crossing between the wiring lines.

Figure 28:
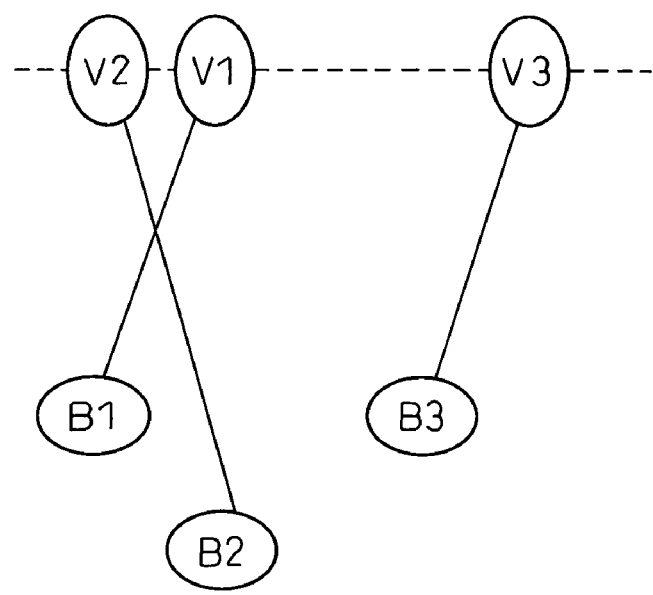
FIG. 28 is a diagram (part 3) for explaining the detailed processing of the crossing presence/absence judgment performed in the tentative placement step of the automatic wiring method according to the embodiment of the present invention.

On the other hand, when the vias V1, V2, and V3 are all located on the same crossing detecting auxiliary line, and when the pads B1 to B3 and their corresponding vias V1 to V3 are respectively arranged in the same direction but in different orders, that is, when the pads are arranged in the order of "B1", "B2", and "B3", but the vias are arranged in the order of "V2", "V1", and "V3", as shown in FIG. 28, a crossing occurs between the wiring line from the pad B1 to the via V1 and the wiring line from the pad B2 to the via V2. In this case, the crossing of the wiring lines can be avoided by first routing the wiring line from the pad B2 through a point to the left of the pad B1 and then connecting the wiring line to the via V2. That is, the crossing can be avoided by rerouting the wiring line in a manner similar to that shown in FIG. 26b. In this way, any crossing, other than the crossing that may occur between the lines from the pads arranged on the same tier to the vias located on the same crossing detecting auxiliary line, can be avoided by ingeniously planning the routing. However, if the crossing can be avoided by ingenious route planning, the result of the wiring may become different from what the designer originally intended. In such cases, it is preferable to give priority to eliminating the crossing rather than sticking to the designer's design intent.

According to the present embodiment, in the crossing presence/absence judgment performed in step S302, the arrangement order of the vias located on the same crossing detecting auxiliary line is compared, on the virtual plane, with the arrangement order of the pads corresponding to the respective vias; then, if the arrangement orders match, it is judged that the wiring lines do not cross each other, but if they do not match, it is judged that the wiring lines do cross each other. As earlier noted, if the vias are not located on the same crossing detecting auxiliary line, it can be safely assumed that the wiring lines do not cross each other between the vias and the pads, regardless of whether the arrangement orders match or not. Further, when the arrangement order of the vias located on the same crossing detecting auxiliary line is compared with the arrangement order of the pads corresponding to the respective vias, if it is determined that the arrangement orders do not match and that the wiring lines cross each other, a wiring route rearranged so as to avoid the crossing is used as the actual wiring route.

The determining step according to the present embodiment will be described in further detail with reference to FIGS. 29a and 29b. FIGS. 29a and 29b are diagrams for explaining the detailed processing of the determining step in the automatic wiring method according to the embodiment of the present invention. In the figures, reference characters B11 to B17, B21 to B25, and B31 to B34 are identification numbers assigned to the pads for convenience. In FIG. 29b, candidates for the wiring route from each pad are indicated by thick arrowed lines.

The following example assumes the case in which the matrix table such as shown in FIG. 29a has been generated in the tentative placement step.

First, for each pad, candidates for the wiring route from the pad to its corresponding via are produced based on the matrix table generated in the tentative placement step. For example, when the pad B21 is considered, two wiring routes, one passing between the pads B11 and B12 and the other between the pads B12 and B13, can be taken as the candidates. Further, when the pad B32 is considered, a wiring route passing between the pads B23 and B24 and between the pads B15 and B16 can be taken as the candidate. On the other hand, when the pad B24 is considered, two wiring routes, one passing between the pads B15 and B16 and the other between the pads B16 and B17, can be taken as the candidates.

Next, each wiring route candidate is evaluated to determine whether the wiring route crosses any other wiring route when it is laid from the pad to the via on the virtual plane. If it is determined that there is a wiring route candidate that does not cross any other wiring line, then the wiring route candidate is determined as being an ideal wiring route, but if it is determined that there are no wiring route candidates that do not cross any other route, then between the wiring route candidates the wiring route candidate that provides the wider clearance is selected, and the selected wiring route candidate is determined as being an ideal wiring route.

For example, for the pad B21, there are two possible wiring route candidates, one passing between the pads B11 and B12 and the other between the pads B12 and B13; here, if neither wiring route crosses any other wiring line, either one of the wiring routes is determined as being an ideal wiring route. If only one of the wiring routes does not cross any other wiring line, that one wiring route is determined as being an ideal wiring route.

On the other hand, for the pad B24, for example, there are two possible wiring route candidates, one passing between the pads B15 and B16 and the other between the pads B16 and B17; here, if both wiring line candidates cross some other wiring line, the wiring route that provides the wider clearance should be selected.

In this way, by performing the above processing in the determining step for all the pads by using a computer, the ideal wiring route from each of the multi-tier bonding pads to the corresponding via can be automatically determined.

Here, if the position of each pad for which the optimum wiring route has been determined is newly mapped to a position that is interposed between adjacent columns in the matrix table and that corresponds to the position between the pads located in a prescribed row that the determined optimum wiring route crosses, then a single-tier bonding pad arrangement can be obtained in which all the pads are arranged in a virtual manner in that prescribed row. If the data representing the single-tier bonding pad arrangement converted in a virtual manner from the multi-tier bonding pad arrangement can be obtained, then by using the data of the single-tier bonding pad arrangement the optimum wiring route from each pad to its corresponding via can be obtained automatically by applying the technique described in Japanese Unexamined Patent Publication No. 2002-083006.

To obtain the single-tier bonding pad arrangement in which all the pads are arranged in a single row in a virtual manner in the matrix table, the position of each pad for which the optimum wiring route has been determined should be newly mapped to a position that is interposed between adjacent columns in the matrix table and that corresponds to the position between the pads located in a prescribed row that the determined optimum wiring route crosses. This will be explained in further detail with reference to FIGS. 30a to 30c.

FIGS. 30a to 30c are diagrams showing, by way of example, the case where the multi-tier bonding pad arrangement is converted into the single-tier bonding pad arrangement based on the matrix table shown in FIGS. 29a and 29b. In the figures, reference characters B11 to B17, B21 to B25, and B31 to B34 are identification numbers assigned to the pads for convenience, and FIG. 30a shows the same diagram as FIG. 29a.

Suppose that optimum wiring routes such as shown by thick arrowed lines in FIG. 30b have been determined in the determining step; here, if the position of each pad for which the optimum wiring route has been determined is newly mapped to a position that is interposed between adjacent columns in the matrix table and that corresponds to the position between the pads located in the first row that the optimum wiring route crosses, then a single-tier bonding pad arrangement can be obtained in which all the pads are arranged in a virtual manner in the first row, as shown in FIG. 30c.

Figure 31B:
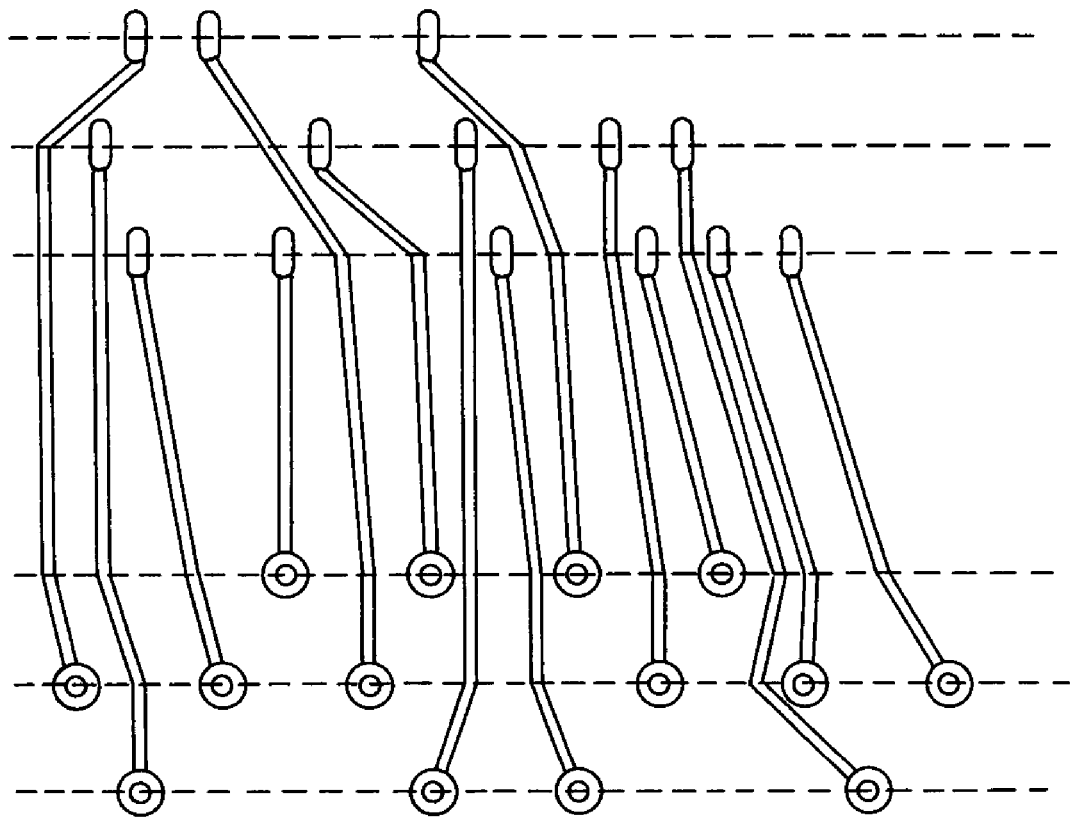

FIGS. 31a and 31b are diagrams showing one example of the result obtained by performing the automatic wiring process for the multi-tier bonding pads according to the embodiment of the present invention.

When the wiring lines from the multi-tier bonding pads arranged in three rows to the vias arranged in three rows are shown in the form of nets as depicted in FIG. 31a, wiring lines free from crossings, such as shown in FIG. 31b, can be automatically determined by computer processing by applying the present invention in conjunction with the technique described in Japanese Unexamined Patent Publication No. 2002-083006.

Figure 32:
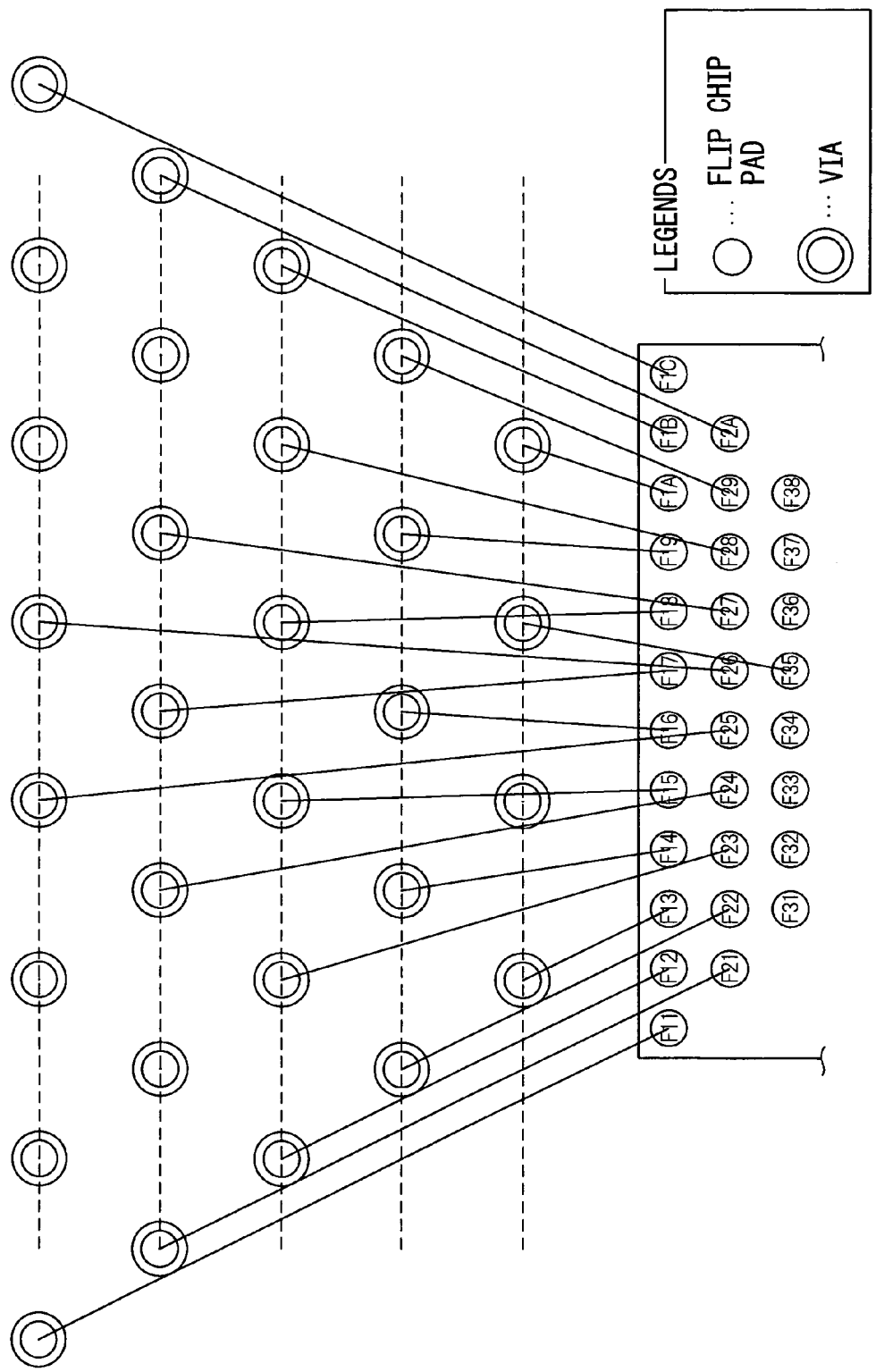
FIG. 32 is a diagram showing by way of example the nets (straight lines) to be routed on a semiconductor package having flip chip pads.

The present invention can be applied not only to multi-tier bonding pads but also to flip chip pads (F/C pads). FIG. 32 is a diagram showing, by way of example, the nets to be routed on a semiconductor package having flip chip pads. In the figure, reference characters F11 to F19, F1A, F1B, F1C, F21 to F29, F2A, and F31 to F38 are identification numbers assigned to the flip chip pads for convenience. The flip chip pads F11 to F19, F1A, F1B, F1C, F21 to F29, F2A, and F31 to F38 are arranged in order in a matrix form.

Figures 33A, 33B, 33C:
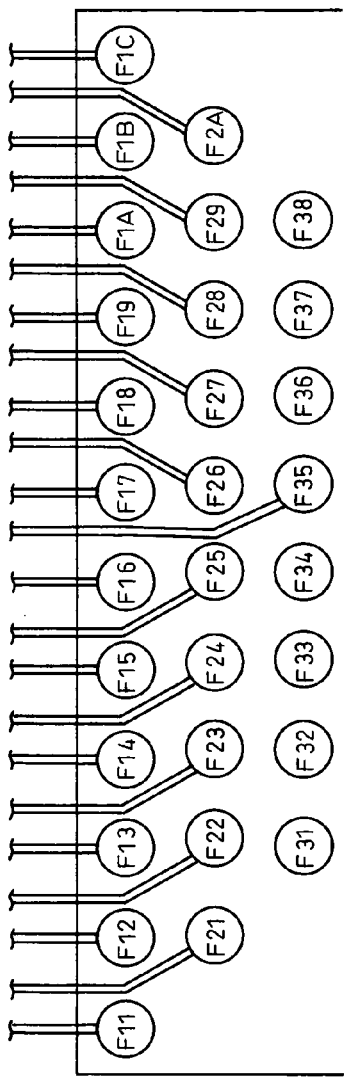
FIGS. 33a to 33c are diagrams for explaining the case where the automatic wiring method of the present invention is applied to the flip chip pads.
Figure 35:
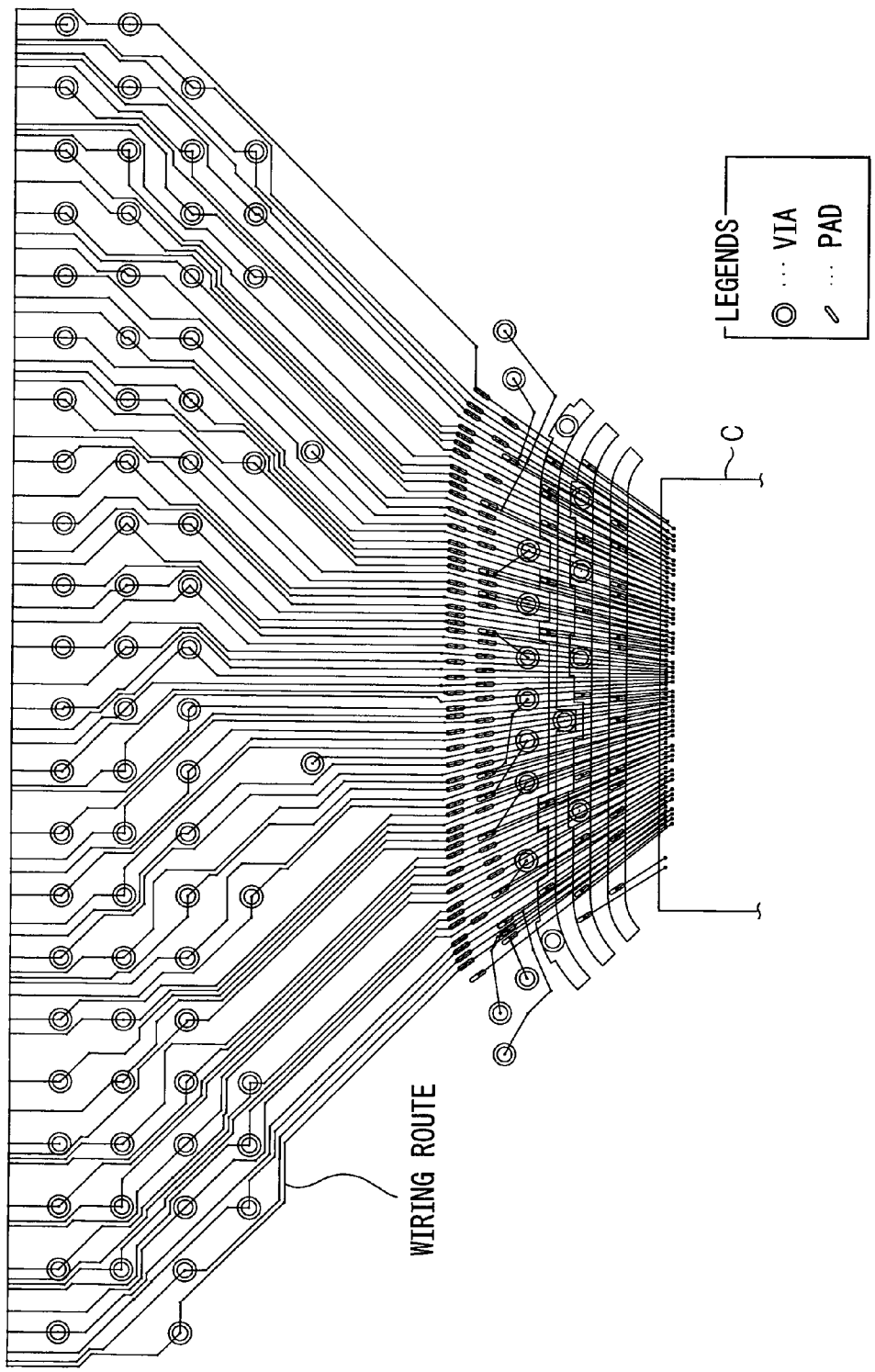
FIG. 35 is a diagram showing an example of actual wiring on the semiconductor package having the multi-tier bonding pads shown in FIG. 34.
Figure 36A:
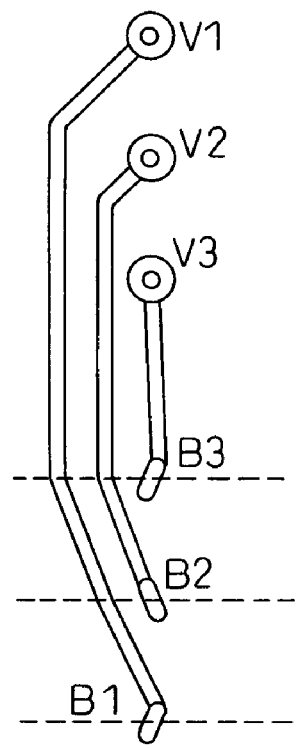
Figure 36B:
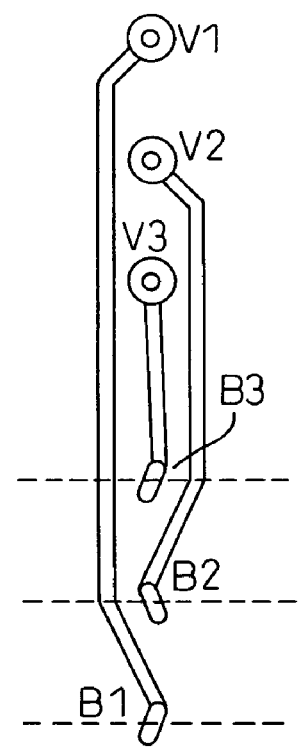
Figure 37A:
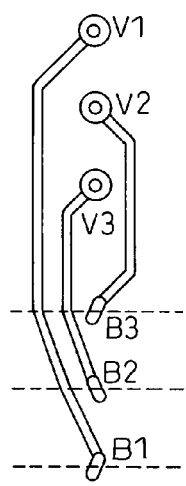
FIGS. 37a to 37e are diagrams (part 2) for explaining a variation of the wiring routing in the multi-tier bonding pad structure.
Figure 37B:
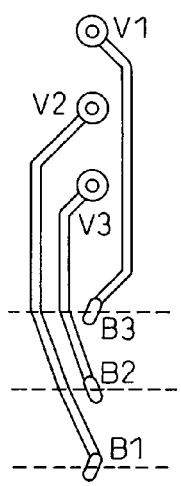
Figure 37C:
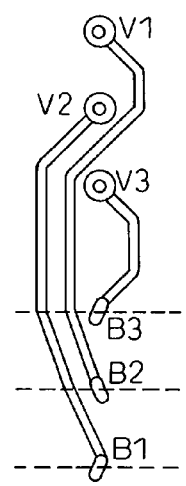
Figure 37D:
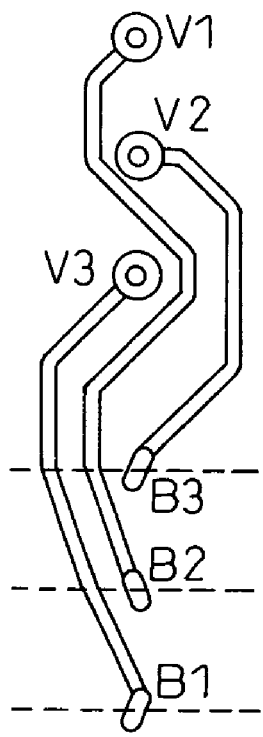
Figure 37E:
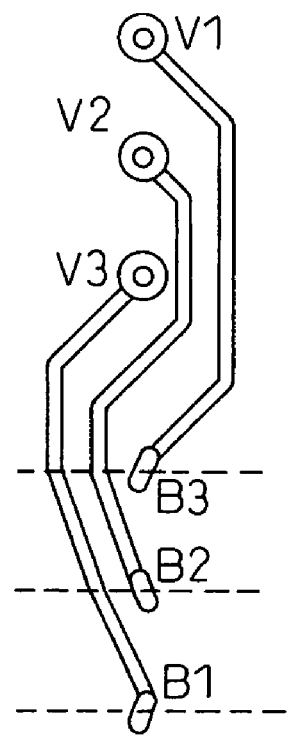
Figure 38:
FIG. 38 is a diagram (part 1) showing an example of the single-tier bonding pad arrangement.
Figure 39:
FIG. 39 is a diagram (part 2) showing an example of the single-tier bonding pad arrangement.
Figure 40:
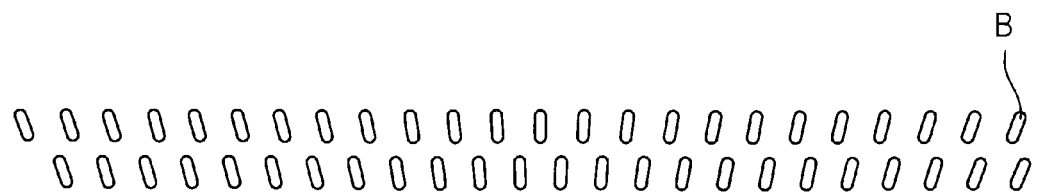
FIG. 40 is a diagram (part 1) showing the bonding pads arranged in two rows as an example of the multi-tier bonding pad arrangement.
Figure 41:
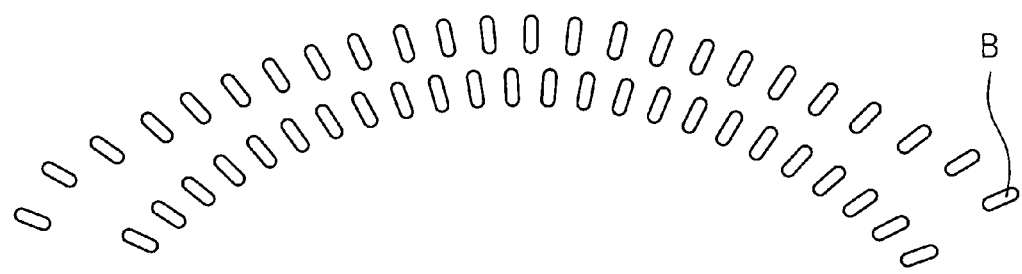
FIG. 41 is a diagram (part 2) showing the bonding pads arranged in two rows as an example of the multi-tier bonding pad arrangement.
Figure 42:
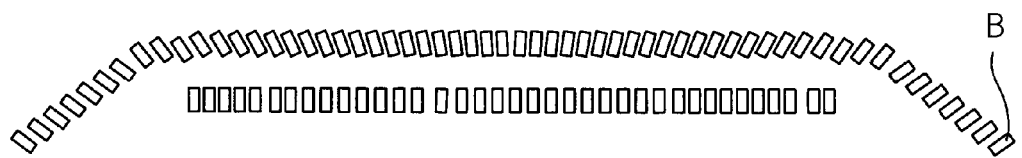
FIG. 42 is a diagram (part 3) showing the bonding pads arranged in two rows as an example of the multi-tier bonding pad arrangement.
Figure 43:
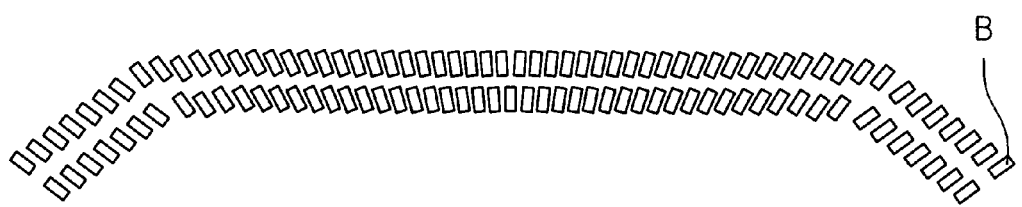
FIG. 43 is a diagram (part 4) showing the bonding pads arranged in two rows as an example of the multi-tier bonding pad arrangement.

FIGS. 33a to 33c are diagrams for explaining the case where the automatic wiring method of the present invention is applied to the flip chip pads. In the figure, reference characters F11 to F19, F1A, F1B, F1C, F21 to F29, F2A, and F31 to F38 are identification numbers assigned to the flip chip pads for convenience.

As the flip chip pads are orderly arranged in a matrix form, as described above, the positions of the flip chip pads can be mapped directly on the matrix table, and neither the row identifying step nor the tentative placement step are specifically needed. When applying the automatic wiring method of the present invention to the flip chip pads, only the flip chip pads that are relevant to wiring are mapped on the matrix table. Whether a flip chip pad is relevant to wiring or not is determined by checking the presence or absence of a rats. In the example of FIG. 33a, of the flip chip pads F11 to F19, F1A, F1B, F1C, F21 to F29, F2A, and F31 to F38, the flip chip pads F11 to F19, F1A, F1B, F1C, F21 to F29, F2A, and F35 are relevant to wiring.

For the flip chip pads shown in FIG. 33a, a matrix table such as shown in FIG. 33b can be easily obtained. Based on this matrix table, optimum wiring routes can be determined by executing the previously described determining step by computer, and a single-tier flip chip pad arrangement with all the pads arranged in a single row on a virtual plane can also be obtained, as shown in FIG. 33c. After that, by applying the technique described in Japanese Unexamined Patent Publication No. 2002-083006 to the single-tier flip chip pads by using a computer, optimum wiring routes can be automatically determined.

As described above, according to the present invention, which achieves the automatic wiring method and apparatus for automating wiring design for a semiconductor package having a multi-tier bonding pad structure, wiring routes of stable quality can be designed easily and in a short period of time without relying on the designer's skill, experience, intuition, etc. as in the prior art.

Further, according to the present invention, the multi-tier bonding pad arrangement can be converted into the single-tier bonding pad arrangement in which the pads are arranged in a virtual manner in a single row; therefore, once the conversion is done, the technique described in Japanese Unexamined Patent Publication No. 2002-083006 can be applied, and in this case also, the optimum wiring routes from the pads to the vias can be automatically determined.

Furthermore, according to the present invention, by using a processing unit, each pad in the multi-tier bonding pad arrangement can be automatically identified as to which row the pad belongs to.

When the present invention is applied to the fabrication of a semiconductor package, such as a PBGA or EBGA package, that has multi-tier bonding pads or flip chip pads in which the pads to be connected to a semiconductor chip are arranged in multiple rows, the wiring design for the semiconductor package can be automatically done by using a processing unit such as a computer. In the prior art which requires manual wiring design work that relies on the designer's skill, experience, intuition, etc. there have been cases where it takes several days to complete the wiring design; in contrast, according to the present invention, as the wiring design can be automatically done by using a processing unit such as a computer even in the case of a complex pad arrangement such as multi-tier bonding pads or flip chip pads, the time required to complete the design can be drastically reduced (for example, a wiring design can be done in a matter of hours), reducing the burden of the designer while, at the same time, achieving stable design quality. This also contributes to reducing the manufacturing cost of the semiconductor package.

What is claimed is:

1. A semiconductor package automatic wiring apparatus which determines an optimum wiring route from each pad to a corresponding one of vias on a semiconductor package having a multi-tier bonding pad structure in which pads to be connected to a semiconductor chip are arranged in multiple rows, said apparatus comprising:
   a row identifier identifying a row for said each pad as to which row said pad belongs to;
   a tentative placer mapping a position of said each pad to a position on a matrix table after said each pad has been identified by said row identifier as to which row said pad belongs to; and
   a determiner reading out said matrix table and determining said optimum wiring route based on said read matrix table, wherein a pad-to-pad space through which said wiring route can pass corresponds to a blank entry between adjacent columns in said matrix table,
   wherein said tentative placer includes
      a drawer drawing an extension line on a virtual plane from said each pad identified by said row identifying as to which row said pad belongs to, said extension line extending in a direction in which a wiring line is run from said semiconductor chip to said pad or in a direction in which said pad is oriented, and
      an evaluator evaluating a positional relationship between the extension line drawn from said pad belonging to a first row and a pad belonging to a second row adjacent to said first row, and
   wherein said matrix table is generated based on said positional relationship evaluated by said evaluator.

2. The semiconductor package automatic wiring apparatus as claimed in claim 1, wherein said row identifier comprises:
   a drawer drawing an auxiliary line on a virtual plane from each of said pads in a direction substantially parallel to a row direction; and
   an identifier indentifying a second one of said pads, which said auxiliary line drawn from a first one of said pads first crosses, as being a pad adjacent to said first pad and belonging to the same row as said first pad.

3. The semiconductor package automatic wiring apparatus as claimed in claim 2, wherein said row identifier further comprises:
   a judger judging whether said identified pad belongs to at least two of said rows;
   a recognizer recognizing said pad, if judged to belong to at least two of said rows, as belonging to one or the other of said at least two rows;
   a drawer drawing another auxiliary line on said virtual plane from said pad judged to belong to at least two of said rows, said other auxiliary line extending in a direction opposite to the direction in which said first drawer has drawn said auxiliary line substantially parallel to said row direction was drawn; and
   a recorder recording an ordering of pads crossed by said other auxiliary line.

4. The semiconductor package automatic wiring apparatus as claimed in claim 2, wherein at least two auxiliary lines are drawn from each of said.

5. The semiconductor package automatic wiring apparatus as claimed in claim 1, further comprising:
   a first mapper mapping the position on said matrix table of said pad belonging to said first row to the same column as said pad belonging to said second row when it is determined by said evaluator that said extension line crosses said pad belonging to said second row; and
   a second mapper mapping the position on said matrix table of said pad belonging to said first row to a column located between two pads belonging to said second row when it is determined by said evaluator that said extension line passes through a point between said two pads.

6. The semiconductor package automatic wiring apparatus as claimed in claim 1 wherein, when there are a plurality of wiring lines to run from said semiconductor chip to said pad, said drawer draws said extension line in the direction in which said pad is oriented.

7. The semiconductor package automatic wiring apparatus as claimed in claim 1 wherein, when there are an odd number of wiring lines to run from said semiconductor chip to said pad which is polygonal in shape, said drawer draws said extension line in a direction in which, of said odd number of wiring lines, the wiring line located in the center is run.

8. The semiconductor package automatic wiring apparatus as claimed in claim 1 wherein, when there are an even number of wiring lines to run from said semiconductor chip to said pad which is polygonal in shape, said drawer draws said extension line as a midline passing through a midpoint between outermost ones of said even number of wiring lines.

9. A semiconductor package automatic wiring apparatus which determines an optimum wiring route from each pad to a corresponding one of vias on a semiconductor package having a multi-tier bonding pad structure in which pads to be connected to a semiconductor chip are arranged in multiple rows, said apparatus comprising:

a row identifier identifying a row for said each pad as to which row said pad belongs to;

a tentative placer mapping a position of said each pad to a position on a matrix table after said each pad has been identified by said row identifier as to which row said pad belongs to; and a determiner reading out said matrix table and determining said optimum wiring route based on said read matrix table, wherein a pad-to-pad space through which said wiring route can pass corresponds to a blank entry between adjacent columns in said matrix table, wherein said determiner includes a producer producing, for said each pad, a candidate for the wiring route from said pad to said via on a virtual plane, based on said matrix table generated by said tentative placer, and a judger judging whether said wiring route crosses any other wiring route when said wiring route is laid from said pad to said via on said virtual plane in accordance with said produced wiring route candidate, and wherein said determiner determines said wiring route candidate as being said optimum wiring route when it is judged that said wiring route does not cross any other wiring route, and said determiner determines, between a plurality of wiring route candidates, a wiring route candidate that provides a wider clearance as being said optimum wiring route when it is judged that said wiring route crosses another wiring route.

10. The semiconductor package automatic wiring apparatus as claimed in claim 9, wherein said judger comprises:

a comparer comparing, on said virtual plane, an arrangement order of said vias located on a same crossing detecting auxiliary line with an arrangement order of said pads corresponding respectively to said vias; and a crossing presence/absence judger judging, if said arrangement orders match, that a crossing of wiring lines does not occur, and for judging, if said arrangement orders do not match, that a crossing of wiring lines occurs.

11. A semiconductor package automatic wiring apparatus which converts a multi-tier bonding pad arrangement, in which pads to be connected to a semiconductor chip are arranged in multiple rows on a semiconductor package, into a single-tier bonding pad arrangement, in which said pads are arranged in a virtual manner in a single row, said apparatus comprising:

means for identifying each of said pads in the multiple rows as to which row said pad belongs to;

means for mapping a position of said each pad to a position on a matrix table after said each pad has been identified; and means for reading out said matrix table and determining said single-tier bonding pad arrangement based on said matrix table wherein said means for mapping includes means for drawing an extension line on a virtual plane from said each identified pad, said extension line extending in a direction in which a wiring line is run from said semiconductor chip to said identified pad or in a direction in which said identified pad is oriented; and means for evaluating a positional relationship between the extension line drawn from said pad belonging to a first row and a pad belonging to a second row adjacent to said first row, and wherein said matrix table is generated based on said evaluated positional relationships.

12. The semiconductor package automatic wiring apparatus as claimed in claim 11, wherein a pad-to-pad space through which a wiring route can pass on said semiconductor package corresponds to a blank entry between adjacent columns in said matrix table.

13. The semiconductor package automatic wiring apparatus as claimed in claim 11, wherein said means for identifying comprises:

means for drawing an auxiliary line, on a virtual plane, from each of said pads in a direction substantially parallel to a row direction; and means for identifying a second one of said pads, which said auxiliary line drawn from a first one of said pads first crosses, as being a pad adjacent to said first pad and belonging to the same row as said first pad.

14. The semiconductor package automatic wiring apparatus as claimed in claim 13, wherein said means for identifying further comprises:

means for judging whether said identified pad belongs to at least two of said rows;

means for recognizing said pad, if judged to belong to at least two of said rows, as belonging to one or the other of said at least two rows;

means for drawing another auxiliary line on said virtual plane from said pad judged to belong to at least two of said rows, said other auxiliary line extending in a direction opposite to the direction from said auxiliary line drawn substantially parallel to said row direction; and means for recording an ordering of the pads crossed by said other auxiliary line.

15. The semiconductor package automatic wiring apparatus as claimed in claim 13, wherein at least two auxiliary lines are drawn from each of said pads.

16. The semiconductor package automatic wiring apparatus as claimed in claim 11, further comprising:

means for mapping the position on said matrix table of said pad belonging to said first row to the same column as said pad belonging to said second row when it is determined that said extension line crosses said pad belonging to said second row; and means for mapping the position, on said matrix table, of said pad belonging to said first row, to a column located between two pads belonging to said second row when it is determined that said extension line passes through a point between said two pads.

17. The semiconductor package automatic wiring apparatus as claimed in claim 11 wherein, when there are a plurality of wiring lines to run from said semiconductor chip to said pad, said means for drawing draws said extension line in the direction in which said pad is oriented.

18. The semiconductor package automatic wiring apparatus as claimed in claim 11 wherein, when there are an odd number of wiring lines to run from said semiconductor chip to said pad which is polygonal in shape, said means for drawing draws said extension line in the direction in which, of said odd number of wiring lines, the wiring line located in the center is run.

19. The semiconductor package automatic wiring apparatus as claimed in claim 11 wherein, when there are an even number of wiring lines to run from said semiconductor chip to said pad which is polygonal in shape, said means for drawing draws said extension line as a midline passing through a midpoint between outermost ones of said even number of wiring lines.

20. A semiconductor package automatic wiring apparatus which converts a multi-tier bonding pad arrangement, in which pads to be connected to a semiconductor chip are arranged in multiple rows on a semiconductor package, into a single-tier bonding pad arrangement, in which said pads are arranged in a virtual manner in a single row, said apparatus comprising:

means for identifying each of said pads in the multiple rows as to which row said pad belongs to;
means for mapping a position of said each pad to a position on a matrix table after said each pad has been identified; and
means for reading out said matrix table and determining said single-tier bonding pad arrangement based on said matrix table,
wherein said means for determining includes
means for producing, for each of said pads, a candidate for a wiring route from said pad to a corresponding one of vias on a virtual plane, based on said matrix table generated by said tentative placement means;
means for judging whether said wiring route crosses any other wiring route when said wiring route is laid from said pad to said via on said virtual plane in accordance with said produced wiring route candidate;
means for determining said wiring route candidate as being an optimum wiring route when it is that said wiring route does not cross any other wiring route; and
means for determining, between a plurality of wiring route candidates, a wiring route candidate that provides a wider clearance as being an optimum wiring route when it is judged that said wiring route crosses another wiring route.

21. The semiconductor package automatic wiring apparatus as claimed in claim 20, wherein said means for judging comprises:
means for comparing, on said virtual plane, an arrangement order of said vias located on the same crossing detecting auxiliary line with an arrangement order of said pads corresponding respectively to said vias,
wherein said means for judging judges, if said arrangement orders match, that a crossing of wiring lines does not occur, and judges, if said arrangement orders do not match, that a crossing of wiring lines occurs.

22. The semiconductor package automatic wiring apparatus as claimed in claim 20, further comprising means for newly mapping the position of said pad associated with said determined optimum wiring route to a position that is interposed between adjacent columns in said matrix table and that corresponds to a position between pads located in a prescribed row that said determined optimum wiring route crosses, wherein
said apparatus determines said single-tier bonding pad arrangement with said pads arranged in a virtual manner in said prescribed row.

23. A semiconductor package automatic wiring method which determines an optimum wiring route from each pad to a corresponding one of vias on a semiconductor package having a multi-tier bonding pad structure in which pads to be connected to a semiconductor chip are arranged in multiple rows, said method comprising:
identifying said each pad as to which row said pad belongs to on a virtual plane;
mapping the position of said each pad to a position on a matrix table after said each pad has been identified as to which row said pad belongs to; and
reading out said matrix table and determining said optimum wiring route based on said read out matrix table, wherein a pad-to-pad space through which said wiring route can pass corresponds to a blank entry between adjacent columns in said matrix table,
wherein said mapping includes
drawing an extension line on said virtual plane from said each pad identified as to which row said pad belongs to, said extension line extending in a direction in which a wiring line is run from said semiconductor chip to said pad or in a direction in which said pad is oriented, and
evaluating a positional relationship between the extension line drawn from said pad belonging to a first row and a pad belonging to a second row adjacent to said first row, and
wherein said matrix table is generated based on said evaluated positional relationship.

24. The semiconductor package automatic wiring method as claimed in claim 23, wherein said identifying comprises:
drawing an auxiliary line from each of said pads in a direction substantially parallel to a row direction; and
identifying a second one of said pads, which said auxiliary line drawn from a first one of said pads first crosses, as being a pad adjacent to said first pad and belonging to the same row as said first pad.

25. The semiconductor package automatic wiring method as claimed in claim 24, wherein said identifying further comprises:
judging whether or not said identified pad belongs to at least two of said rows;
recognizing said pad, if judged to belong to at least two of said rows, as belonging to one or the other of said at least two rows;
drawing another auxiliary line on said virtual plane from said pad judged to belong to at least two of said rows, said other auxiliary line extending in a direction opposite to the direction from said auxiliary line substantially parallel to said row direction; and
recording an ordering of the pads crossed by said other auxiliary line.

26. The semiconductor package automatic wiring method as claimed in claim 24, wherein at least two auxiliary lines are drawn from each of said pads.

27. The semiconductor package automatic wiring method as claimed in claim 23, further comprising:
mapping the position on said matrix table of said pad belonging to said first row to the same column as said pad belonging to said second row when it is determined that said extension line crosses said pad belonging to said second row; and
mapping the position on said matrix table of said pad belonging to said first row to a column located between two pads belonging to said second row when it is determined that said extension line passes through a point between said two pads.

28. The semiconductor package automatic wiring method as claimed in claim 23 wherein, when there are a plurality of wiring lines to run from said semiconductor chip to said pad, said extension line is drawn in the direction in which said pad is oriented.

29. The semiconductor package automatic wiring method as claimed in claim 23 wherein, when there are an odd number of wiring lines to run from said semiconductor chip to said pad which is polygonal in shape, said extension line is drawn in the direction in which, of said odd number of wiring lines, the wiring line located in the center is run.

30. The semiconductor package automatic wiring method as claimed in claim 23 wherein, when there are an even number of wiring lines to run from said semiconductor chip to said pad which is polygonal in shape, said extension line is drawn as a midline passing through a midpoint between outermost ones of said even number of wiring lines.

31. A semiconductor package automatic wiring method which determines an optimum wiring route from each pad to a corresponding one of vias on a semiconductor package having a multi-tier bonding pad structure in which pads to be connected to a semiconductor chip are arranged in multiple rows, said method comprising:
   identifying said each pad as to which row said pad belongs to on a virtual plane;
   mapping the position of said each pad to a position on a matrix table after said each pad has been identified as to which row said pad belongs to; and
   reading out said matrix table and determining said optimum wiring route based on said read out matrix table, wherein a pad-to-pad space through which said wiring route can pass corresponds to a blank entry between adjacent columns in said matrix table,
   wherein said determining includes
   producing, for each of said pads, a candidate for the wiring route from said pad to said via on said virtual plane, based on said matrix table;
   judging whether said wiring route crosses any other wiring route when said wiring route is laid from said pad to said via on said virtual plane in accordance with said produced wiring route candidate;
   determining said wiring route candidate as being said optimum wiring route when it is judged that said wiring route does not cross any other wiring route; and
   determining, between a plurality of wiring route candidates, a wiring route candidate that provides a wider clearance as being said optimum wiring route when it is judged that said wiring route crosses another wiring route.

32. The semiconductor package automatic wiring method as claimed in claim 31, wherein said judging comprises:
   comparing, on said virtual plane, an arrangement order of said vias located on the same crossing detecting auxiliary line with an arrangement order of said pads corresponding respectively to said vias,
   wherein said judging judges, if said arrangement orders match, that a crossing of wiring lines does not occur, and judges, if said arrangement orders do not match, that a crossing of wiring lines occurs.

33. A semiconductor package automatic wiring method which converts a multi-tier bonding pad arrangement, in which pads to be connected to a semiconductor chip are arranged in multiple rows on a semiconductor package, into a single-tier bonding pad arrangement, in which said pads are arranged in a virtual manner in a single row, said method comprising:
   identifying each of said pads in the multiple rows as to which row said pad belongs to;
   mapping the position of said each pad to a position on a matrix table after said each pad has been identified as to which row said pad belongs to; and
   reading out said matrix table and determining said single-tier bonding pad arrangement based on said read out matrix table,
   wherein said mapping includes
   drawing an extension line from said each identified pad as to which row said pad belongs to, said extension line extending in a direction in which a wiring line is run from said semiconductor chip to said pad or in a direction in which said pad is oriented, and
   evaluating a positional relationship between the extension line drawn from said pad belonging to a first row and a pad belonging to a second row adjacent to said first row, and
   wherein said matrix table is generated based on said evaluated positional relationship.

34. The semiconductor package automatic wiring method as claimed in claim 33, wherein a pad-to-pad space through which a wiring route can pass on said semiconductor package corresponds to a blank entry between adjacent columns in said matrix table.

35. The semiconductor package automatic wiring method as claimed in claim 33, wherein said identifying comprises:
   drawing an auxiliary line on a virtual plane from each of said pads in a direction substantially parallel to a row direction; and
   identifying a second one of said pads, which said auxiliary line drawn from a first one of said pads first crosses, as being a pad adjacent to said first pad and belonging to the same row as said first pad.

36. The semiconductor package automatic wiring method as claimed in claim 35, wherein said identifying further comprises:
   judging whether said identified pad belongs to at least two of said rows;
   recognizing said pad, if judged to belong to at least two of said rows, as belonging to one or the other of said at least two rows;
   drawing another auxiliary line on said virtual plane from said pad judged to belong to at least two of said rows, said other auxiliary line extending in a direction opposite to the direction in which said auxiliary has been drawn substantially parallel to said row direction; and
   recording an ordering of the pads crossed by said other auxiliary line.

37. The semiconductor package automatic wiring method as claimed in claim 35, wherein at least two auxiliary lines are drawn from each of said pads.

38. The semiconductor package automatic wiring method as claimed in claim 33, further comprising:
   mapping the position on said matrix table of said pad belonging to said first row to the same column as said pad belonging to said second row when it is determined that said extension line crosses said pad belonging to said second row; and
   mapping the position on said matrix table of said pad belonging to said first row to a column located between two pads belonging to said second row when it is determined that said extension line passes through a point between said two pads.

39. The semiconductor package automatic wiring method as claimed in claim 33 wherein, when there are a plurality of wiring lines to run from said semiconductor chip to said pad, said extension line is drawn in the direction in which said pad is oriented.

40. The semiconductor package automatic wiring method as claimed in claim 33 wherein, when there are an odd number of wiring lines to run from said semiconductor chip to said pad which is polygonal in shape, said extension line is drawn in the direction in which, of said odd number of wiring lines, the wiring line located in the center is run.

41. The semiconductor package automatic wiring method as claimed in claim 33 wherein, when there are an even number of wiring lines to run from said semiconductor chip to said pad which is polygonal in shape, said extension line is drawn as a midline passing through a midpoint between outermost ones of said even number of wiring lines.

42. The semiconductor package automatic wiring method which converts a multi-tier bonding pad arrangement, in which pads to be connected to a semiconductor chip are arranged in multiple rows on a semiconductor package, into a single-tier bonding pad arrangement, in which said pads are arranged in a virtual manner in a single row, said method comprising:

identifying each of said pads in the multiple rows as to which row said pad belongs to;

mapping the position of said each pad to a position on a matrix table after said each pad has been identified as to which row said pad belongs to; and reading out said matrix table and determining said single-tier bonding pad arrangement based on said read out matrix table, wherein said determining includes producing, for each of said pads, a candidate for a wiring route from said pad to a corresponding one of vias on a virtual plane, based on said matrix table;

judging whether said wiring route crosses any other wiring route when said wiring route is laid from said pad to said via on said virtual plane in accordance with said produced wiring route candidate;

determining said wiring route candidate as being an optimum wiring route when it is judged that said wiring route does not cross any other wiring route; and determining, between a plurality of wiring route candidates, a wiring route candidate that provides a wider clearance as being an optimum wiring route when it is judged that said wiring route crosses another wiring route.

43. The semiconductor package automatic wiring method as claimed in claim 42, wherein said judging comprises:

comparing, on said virtual plane, an arrangement order of said vias located on the same crossing detecting auxiliary line with an arrangement order of said pads corresponding respectively to said vias, wherein said judging judges, if said arrangement orders match, that a crossing of wiring lines does not occur, and judges, if said arrangement orders do not match, that a crossing of wiring lines occurs.

44. The semiconductor package automatic wiring method as claimed in claim 42, further comprising mapping the position of said pad associated with said determined optimum wiring route to a position that is interposed between adjacent columns in said matrix table and that corresponds to a position between pads located in a prescribed row that said determined optimum wiring route crosses, wherein said method determines said single-tier bonding pad arrangement with said pads arranged in a virtual manner in said prescribed row.

* * * * *

UNITED STATES PATENT AND TRADEMARK OFFICE
CERTIFICATE OF CORRECTION

PATENT NO. : 7,496,878 B2
APPLICATION NO. : 11/103626
DATED : February 24, 2009
INVENTOR(S) : Tamotsu Kitamura et al.

It is certified that error appears in the above-identified patent and that said Letters Patent is hereby corrected as shown below:

Column 20, Line 14, change "indentifying" to --identifying--.

Column 26, Line 37, change "said auxiliary has" to --said auxiliary line has--.

Signed and Sealed this

Second Day of June, 2009

JOHN DOLL
*Acting Director of the United States Patent and Trademark Office*